United States Patent
Park et al.

(10) Patent No.: US 11,527,293 B2
(45) Date of Patent: Dec. 13, 2022

(54) NONVOLATILE MEMORY DEVICE AND METHOD OF PROGRAMMING IN THE SAME

(71) Applicant: SAMSUNG ELECTRONICS CO., LTD., Suwon-si (KR)

(72) Inventors: Jungmin Park, Seoul (KR); Kyunghoon Sung, Seongnam-si (KR); Ilhan Park, Suwon-si (KR); Jisang Lee, Iksan-si (KR); Joon Suc Jang, Hwaseong-si (KR); Sanghyun Joo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1 day.

(21) Appl. No.: 17/341,837

(22) Filed: Jun. 8, 2021

(65) Prior Publication Data
US 2022/0115073 A1    Apr. 14, 2022

(30) Foreign Application Priority Data

Oct. 8, 2020  (KR) .................. 10-2020-0130210

(51) Int. Cl.
*G11C 16/04*    (2006.01)
*G11C 16/24*    (2006.01)
(Continued)

(52) U.S. Cl.
CPC .......... *G11C 16/24* (2013.01); *G11C 16/0483* (2013.01); *G11C 16/10* (2013.01);
(Continued)

(58) Field of Classification Search
CPC ...... G11C 16/24; G11C 16/0483; G11C 16/10
See application file for complete search history.

(56) References Cited

U.S. PATENT DOCUMENTS

| | | |
|---|---|---|
| 8,320,184 B2 | 11/2012 | Yang et al. |
| 8,988,939 B2 | 3/2015 | Dunga et al. |

(Continued)

FOREIGN PATENT DOCUMENTS

| | | |
|---|---|---|
| KR | 1020150117152 | 10/2015 |
| KR | 10-1721005 | 3/2017 |

(Continued)

*Primary Examiner* — Pho M Luu
(74) *Attorney, Agent, or Firm* — F. Chau & Associates, LLC

(57) ABSTRACT

A nonvolatile memory device includes cell strings commonly connected between bitlines and a source line where the cell strings are grouped into memory blocks. During a precharge period, channels of the cell strings of a selected memory block are precharged by applying a gate induced drain leakage (GIDL) on voltage to gates of GIDL transistors included in the cell strings of the selected memory block where the GIDL on voltage has a voltage level to induce GIDL. During the precharge period, precharge of channels of the cell strings of an unselected memory block are prevented by controlling a gate voltage of GIDL transistors included in the cell strings of the unselected memory block to prevent the GIDL. During a program execution period after the precharge period, memory cells of the selected memory block connected to a selected wordline are programmed by applying a program voltage to the selected wordline.

20 Claims, 24 Drawing Sheets

(51) Int. Cl.
 G11C 16/10 (2006.01)
 H01L 25/065 (2006.01)
 H01L 23/00 (2006.01)
 H01L 25/18 (2006.01)
(52) U.S. Cl.
 CPC .......... *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(56) References Cited

U.S. PATENT DOCUMENTS

| | | | |
|---|---|---|---|
| 9,263,137 B2 | 2/2016 | Lee | |
| 9,842,653 B2 | 12/2017 | Lee | |
| 10,714,184 B2 | 7/2020 | Joe et al. | |
| 10,923,196 B1 * | 2/2021 | Rabkin | G11C 16/32 |
| 10,957,412 B2 * | 3/2021 | Lee | G11C 11/4093 |
| 11,362,175 B1 * | 6/2022 | Fayrushin | H01L 27/11519 |
| 2015/0294726 A1 | 10/2015 | Sim et al. | |

FOREIGN PATENT DOCUMENTS

| | | |
|---|---|---|
| KR | 1020170086932 | 7/2017 |
| KR | 1020190103820 | 9/2019 |

* cited by examiner

NONVOLATILE MEMORY DEVICE AND METHOD OF PROGRAMMING IN THE SAME

CROSS-REFERENCE TO RELATED APPLICATIONS

This U.S. non-provisional application claims priority under 35 U.S.C. § 119 to Korean Patent Application No. 10-2020-0130210, filed on Oct. 8, 2020 in the Korean Intellectual Property Office (KIPO), the disclosure of which is incorporated by reference herein in its entirety.

TECHNICAL FIELD

Example embodiments relate generally to semiconductor integrated circuits, and more particularly, to a nonvolatile memory device and a method of programming in the nonvolatile memory device.

DISCUSSION OF RELATED ART

Nonvolatile memory devices may maintain stored data even when power is off. While volatile memory devices may be used as main memories of various apparatuses, nonvolatile memory devices may be used for storing program codes and/or data in various electronic devices such as, for example, computers, mobile devices, etc.

Recently, nonvolatile memory devices of three-dimensional structures such as vertical NAND memory devices have been developed to increase the integration degree and memory capacity of nonvolatile memory devices. Along with increases in the integration degree and memory capacity, disturbance on memory cells may increase while the memory cells are programmed.

SUMMARY

Some example embodiments may provide a nonvolatile memory device and a method of programming in a nonvolatile memory device capable of reducing disturbance on memory cells during a program operation.

According to example embodiments, a method of programming in a nonvolatile memory device including a plurality of cell strings commonly connected between a plurality of bitlines and a source line where the plurality of cell strings are grouped into a plurality of memory blocks, includes, during a precharge period, precharging channels of the cell strings of a selected memory block among the plurality of memory blocks by applying a gate induced drain leakage (GIDL) on voltage to gates of GIDL transistors included in the cell strings of the selected memory block where the GIDL on voltage has a voltage level to induce GIDL. The method further includes, during the precharge period, preventing precharge of channels of the cell strings of an unselected memory block among the plurality of memory blocks by controlling a gate voltage of GIDL transistors included in the cell strings of the unselected memory block to prevent the GIDL. The method further includes, during a program execution period after the precharge period, programming memory cells of the selected memory block connected to a selected wordline by applying a program voltage to the selected wordline.

According to example embodiments, a nonvolatile memory device includes a memory cell array including a plurality of cell strings commonly connected between a plurality of bitlines and a source line, where the plurality of cell strings are grouped into a plurality of memory block, and a control circuit. The control circuit is configured to, during a precharge period, precharge channels of the cell strings of a selected memory block among the plurality of memory blocks by applying a gate induced drain leakage (GIDL) on voltage to gates of GIDL transistors included in the cell strings of the selected memory block, the GIDL on voltage having a voltage level to induce GIDL. The control circuit is further configured to, during the precharge period, prevent precharge of channels of the cell strings of an unselected memory block among the plurality of memory blocks by controlling a gate voltage of GIDL transistors included in the cell strings of the unselected memory block to prevent the GIDL. The control circuit is further configured to, during a program execution period after the precharge period, program memory cells of the selected memory block connected to a selected wordline by applying a program voltage to the selected wordline.

According to example embodiments, a nonvolatile memory device includes first metal pads disposed in a cell region, second metal pads disposed in a peripheral region disposed under the cell region, wherein the peripheral region is vertically connected to the cell region by the first metal pads and the second metal pads, a plurality of bitlines disposed at a first end portion of the cell region, arranged in a first horizontal direction, and extending in a second horizontal direction, a source line disposed at a second end portion of the cell region and extending in the second horizontal direction, a plurality of cell channel structures disposed in a cell string area of the cell region and commonly connected between the plurality of bitlines and the source line, wherein the plurality of cell channel structures is grouped into a plurality of memory blocks and each one of the cell channel structures includes a string selection transistor, a ground selection transistor, and memory cells, a gate electrode structure vertically stacked in the cell string area, wherein the gate electrode structure includes string selection lines, ground selection lines, and wordlines, and a control circuit disposed in the peripheral region. The control circuit is configured to, during a precharge period, precharge channels of the cell channel structures of a selected memory block among the plurality of memory blocks by applying a gate induced drain leakage (GIDL) on voltage to the string selection line or the ground selection line of the selected memory block, the GIDL on voltage having a voltage level to induce GIDL. The control circuit is further configured to, during the precharge period, prevent precharge of channels of the cell channel structures of an unselected memory block among the plurality of memory blocks by controlling a voltage of the string selection line or the ground selection line of the unselected memory block to prevent the GIDL. The control circuit is further configured to, during a program execution period after the precharge period, program memory cells of the selected memory block connected to a selected wordline by applying a program voltage to the selected wordline.

The nonvolatile memory device and the method of programming in the nonvolatile memory device according to example embodiments may reduce the soft erase of the unselected memory block by preventing the precharge of the unselected memory block while precharging the channels of the selected memory block.

In addition, the nonvolatile memory device and the method of programming in the nonvolatile memory device according to example embodiments may reduce program voltage disturbance and pass voltage disturbance by precharging the channels of the selected memory block.

BRIEF DESCRIPTION OF THE DRAWINGS

The above and other features of the present inventive concept will become more apparent by describing in detail example embodiments thereof with reference to the accompanying drawings, in which.

DETAILED DESCRIPTION OF THE EMBODIMENTS

Figure 1:
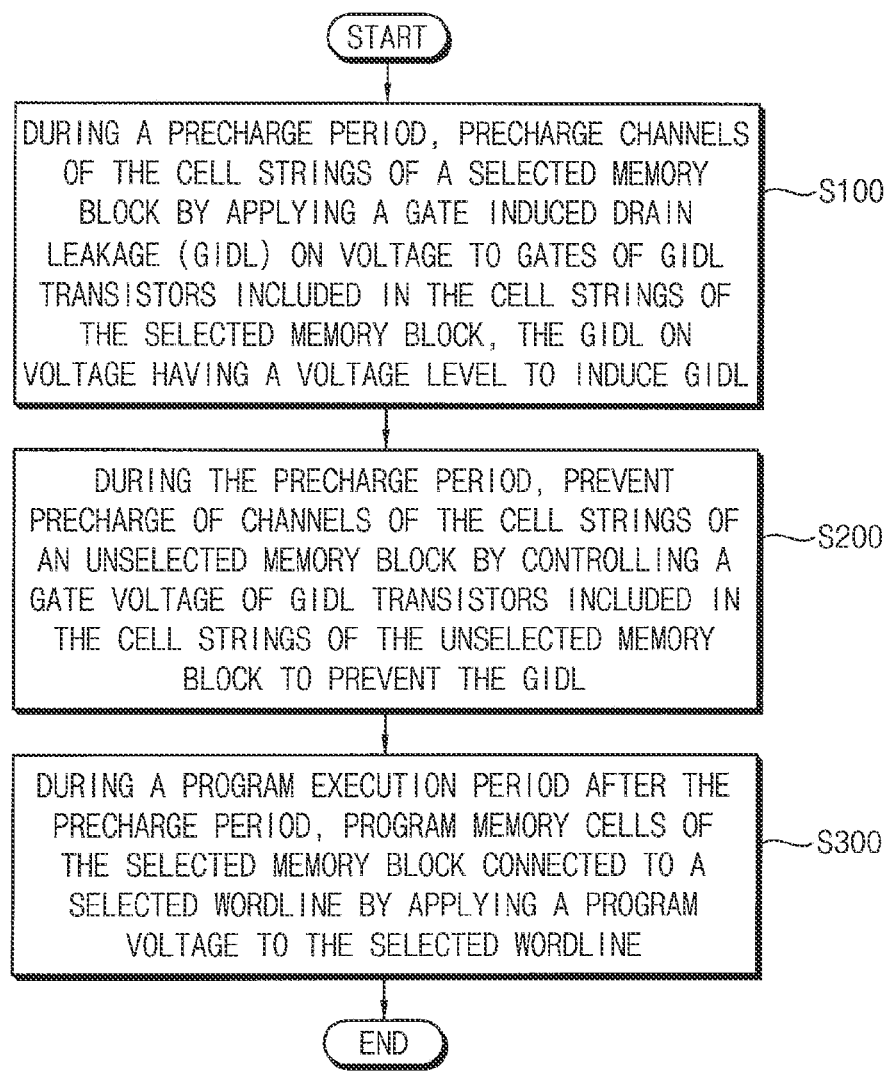
FIG. 1 is a flowchart illustrating a method of programming in a nonvolatile memory device according to example embodiments.

Example embodiments of the present inventive concept will be described more fully hereinafter with reference to the accompanying drawings. Like reference numerals may refer to like elements throughout the accompanying drawings, and repeated descriptions may be omitted.

FIG. 1 is a flowchart illustrating a method of programming in a nonvolatile memory device according to example embodiments.

A method according to example embodiments may be applied to a nonvolatile memory device including a plurality of cell strings commonly connected between a plurality of bitlines and a source line. The plurality of cell strings may be grouped into a plurality of memory blocks. In this disclosure, a memory block indicates a group of cell strings that is controlled by wordlines dedicated to each memory block, as will be described below with reference to FIG. 7.

Referring to FIG. 1, during a precharge period, channels of the cell strings of a selected memory block among the plurality of memory blocks are precharged by applying a gate induced drain leakage (GIDL) on voltage to gates of GIDL transistors included in the cell strings of the selected memory block, where the GIDL on voltage has a voltage level to induce GIDL (S100).

During the precharge period, precharge of channels of the cell strings of an unselected memory block among the plurality of memory blocks may be prevented by controlling a gate voltage of GIDL transistors included in the cell strings of the unselected memory block to prevent or reduce the GIDL (S200).

During a program execution period after the precharge period, memory cells of the selected memory block connected to a selected wordline are programmed by applying a program voltage to the selected wordline (S300).

GIDL indicates a phenomenon in which a leakage occurs at a drain of a transistor by a gate of the transistor. For example, when OV or a negative voltage level is applied to the gate and a sufficiently high positive voltage is applied to the drain, severe band bending may be induced in the oxide near the drain, and thus, band-to-band tunneling from the valence band of the silicon surface to the conduction band of the silicon body may occur.

The tunneling elections are attracted to the drain and the drain current increases. The semiconductor substrate is typically biased by a ground voltage, and holes are attracted to the semiconductor substrate of a relatively low voltage. The gate voltage of a negative voltage level is used to turn off the transistor, but the transistor operates as if it is turned on because the drain current of the GIDL current increases due to the GIDL phenomenon. The GIDL current increases as the gate voltage is decreased and/or the drain voltage is increased.

Program voltage disturbance and pass voltage disturbance may be reduced by precharging the channels of the selected memory block using the GIDL to further increase a boosting voltage of the channels according to application of a wordline voltage.

In contrast, boosting of the channels is unnecessary in the case of the unselected memory block because a program voltage is not applied to the unselected memory block. In conventional schemes, the channels of the unselected memory block are precharged together with the precharge of the channels of the selected memory block, which may result in the memory cells of the unselected memory block being unintentionally softly erased. According to example embodiments, the soft erase of the unselected memory block may be prevented or reduced by preventing the precharge of the unselected memory block.

In some example embodiments, as will be described below with reference to FIGS. 7 through 11, the GIDL transistors may include GIDL string selection transistors that are connected to the plurality of bitlines. In this case, a uni-directional channel precharge may be performed during the precharge period by applying a GIDL drain voltage to the plurality of bitlines such that the GIDL drain voltage has a voltage level higher than a voltage difference between a GIDL threshold voltage and the GIDL on voltage.

In some example embodiments, as will be described below with reference to FIGS. 12 through 16, the GIDL transistors may include GIDL ground selection transistors that are connected to the source line. In this case, a uni-directional channel precharge may be performed during the precharge period by applying the GIDL drain voltage to the source line.

In some example embodiments, as will be described below with reference to FIGS. 17 through 21, the GIDL transistors may include GIDL string selection transistors that are connected to the plurality of bitlines and GIDL ground selection transistors that are connected to the source line. In this case, a bi-directional channel precharge may be performed during the precharge period by applying the GIDL drain voltage to at least a portion of the plurality of bitlines and applying the GIDL drain voltage to the source line.

Figure 2:
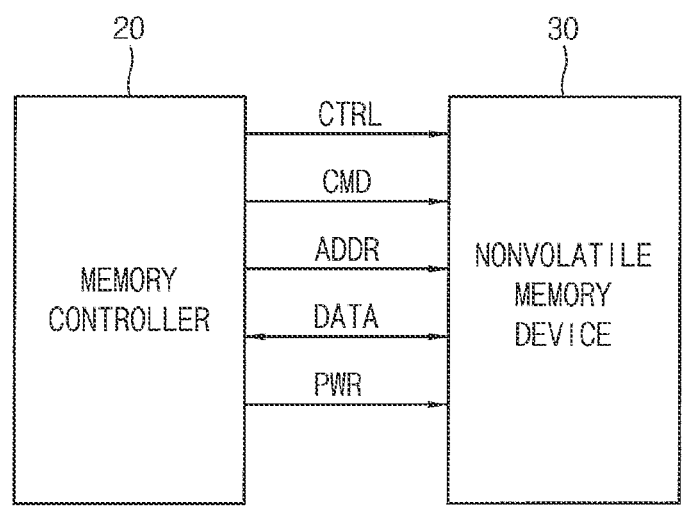
FIG. 2 is a block diagram illustrating a memory system according to example embodiments.

FIG. 2 is a block diagram illustrating a memory system according to example embodiments.

Referring to FIG. 2, a memory system 10 may include a memory controller 20 and at least one memory device 30.

The memory device 30 may be a nonvolatile memory device as described herein. The memory system 10 may include data storage media based on a flash memory such as, for example, a memory card, a universal serial bus (USB) memory and a solid state drive (SSD).

The nonvolatile memory device 30 may perform a read operation, an erase operation, and a program operation or a write operation under control of the memory controller 20. The nonvolatile memory device 30 receives a command signal CMD, an address signal ADDR and data DATA through input/output lines from the memory controller 20 for performing such operations. In addition, the nonvolatile memory device 30 receives a control signal CTRL through a control line from the memory controller 20. In addition, the nonvolatile memory device 30 receives power PWR through a power line from the memory controller 20.

Figure 3:
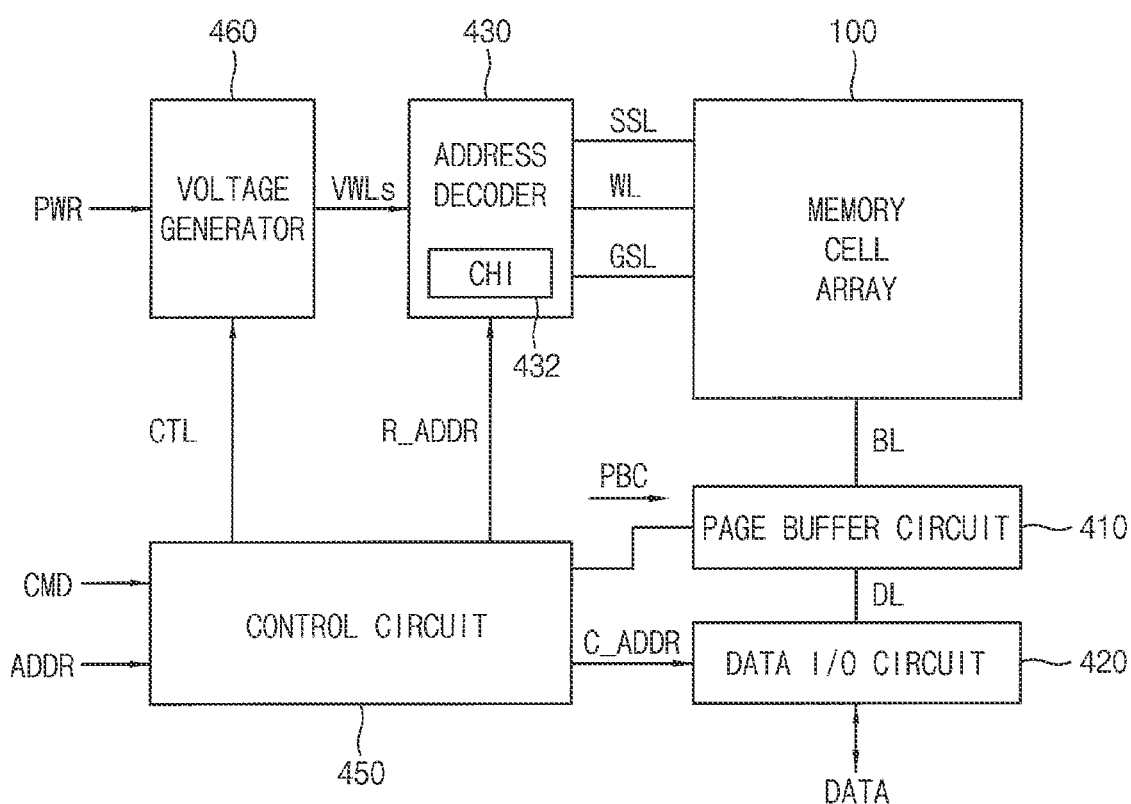
FIG. 3 is a block diagram illustrating an example embodiment of a nonvolatile memory device included in the memory system of FIG. 2.

FIG. 3 is a block diagram illustrating an example embodiment of a nonvolatile memory device included in the memory system of FIG. 2.

Referring to FIG. 3, the nonvolatile memory device 30 includes a memory cell array 100, a page buffer circuit 410, a data input/output circuit 420, an address decoder 430, a control circuit 450 and a voltage generator 460.

The memory cell array 100 may be coupled to the address decoder 430 through a plurality of string selection lines SSL, a plurality of wordlines WL, and a plurality of ground selection lines GSL. In addition, the memory cell array 100 may be coupled to the page buffer circuit 410 through a plurality of bitlines BL.

The memory cell array 100 may include a plurality of memory cells coupled to the plurality of wordlines WL and the plurality of bitlines BL. In some example embodiments, the memory cell array 100 may be a three-dimensional memory cell array, which is formed on a substrate in a three-dimensional structure (or a vertical structure). In this case, the memory cell array 100 may include a plurality of NAND strings that are vertically oriented such that at least one memory cell is located over another memory cell.

The control circuit 450 may receive a command signal CMD and an address signal ADDR from the memory controller 20. The control circuit 450 may control erase, programming and read operations of the nonvolatile memory device 30 based on the command signal CMD and the address signal ADDR. An erase operation may include performing a sequence of erase loops, and a program operation may include performing a sequence of program loops. Each program loop may include a program operation and a program verification operation. Each erase loop may include an erase operation and an erase verification operation. The read operation may include a normal read operation and a data recovery read operation.

For example, the control circuit 450 may generate control signals CTL, which are used for controlling the voltage generator 460, generate a page buffer control signal PBC for controlling the page buffer circuit 410, based on the command signal CMD, and generate a row address R_ADDR and a column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 100 through the plurality of string selection lines SSL, the plurality of wordlines WL, and the plurality of ground selection lines GSL. During the program operation or the read operation, the address decoder 430 may determine one of the plurality of wordlines WL as a selected wordline and determine the rest of the plurality of wordlines WL, except for the selected wordline, as unselected wordlines, based on the row address R_ADDR.

In addition, during the program operation or the read operation, the address decoder 430 may determine one of the plurality of string selection lines SSL as a selected string selection line, and determine the rest of the plurality of string selection lines SSL except for the selected string selection line as unselected string selection lines based on the row address R_ADDR.

The voltage generator 460 may generate wordline voltages VWL, which may be utilized for the operation of the memory cell array 100 of the nonvolatile memory device 30, based on the control signals CTL. The voltage generator 460 may receive the power PWR from the memory controller 20. The wordline voltages VWL may be applied to the plurality of wordlines WL through the address decoder 430.

For example, during the program operation, the voltage generator 460 may apply a program voltage to the selected wordline, and apply a program pass voltage to the unselected wordlines. In addition, during the program verification operation, the voltage generator 460 may apply a program verification voltage to the selected wordline, and apply a verification pass voltage to the unselected wordlines. In addition, during the normal read operation, the voltage generator 460 may apply a read voltage to the selected wordline, and apply a read pass voltage to the unselected wordlines.

The page buffer circuit 410 may be coupled to the memory cell array 100 through the plurality of bitlines BL. The page buffer circuit 410 may include a plurality of buffers. In some example embodiments, each buffer may be connected to one bitline. In some example embodiments, each buffer may be connected to two or more bitlines.

The page buffer circuit 410 may temporarily store data to be programmed in a selected page or data read out from the selected page of the memory cell array 100.

The data input/output circuit 420 may be coupled to the page buffer circuit 410 through data lines DL. During the program operation, the data input/output circuit 420 may receive program data DATA received from the memory controller 20, and provide the program data DATA to the page buffer circuit 410 based on the column address C_ADDR received from the control circuit 450. During the read operation, the data input/output circuit 420 may provide read data DATA, having been read from the memory cell array 100 and stored in the page buffer circuit 410, to the memory controller 20 based on the column address C_ADDR received from the control circuit 450.

The address decoder 430 may include a channel initializer CHI 432. In general, channel initialization is performed through the string selection line SSL and the bitline BL connected to a cell string. However, when a memory cell adjacent to a string selection transistor is programmed first, the channel initialization or channel precharge may not be performed through the string selection transistor and the bitline SSL. The channel initializer 432 may determine a proper program order and perform the channel initialization based on the program order. For example, the channel initializer 432 may determine time points of applying the voltages to the string selection line SSL, the ground selection line GSL and a common source line.

Hereinafter, a third direction D3 indicates a direction perpendicular to an upper surface of a semiconductor substrate, and a first direction D1 and a second direction D2 indicate two directions parallel to the upper surface of the semiconductor substrate. For example, the first direction D1 and the second direction D2 may be perpendicular to each other. The third direction D3 may be referred to as a vertical direction, the first direction D1 may be referred to as a row direction and the second direction D2 may be referred to as a column direction. The direction indicated by an arrow in figures and the opposite direction may be considered as the same direction.

Figure 4:
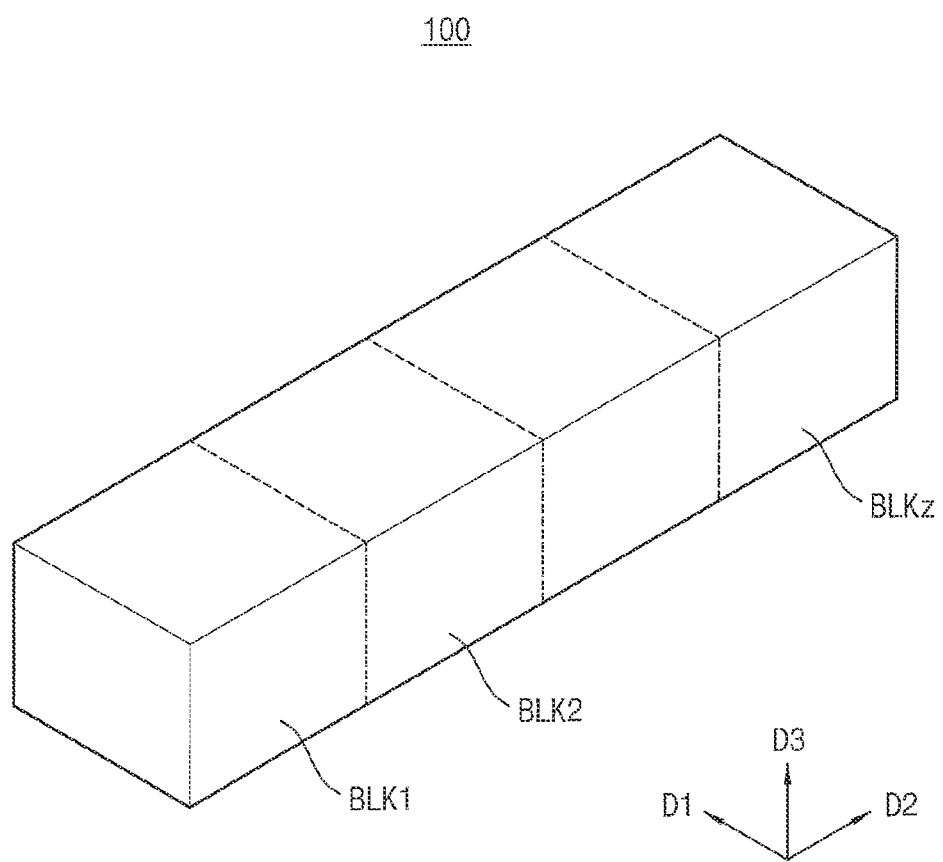
FIG. 4 is a block diagram illustrating a memory cell array included in the nonvolatile memory device of FIG. 3.
Figure 5:
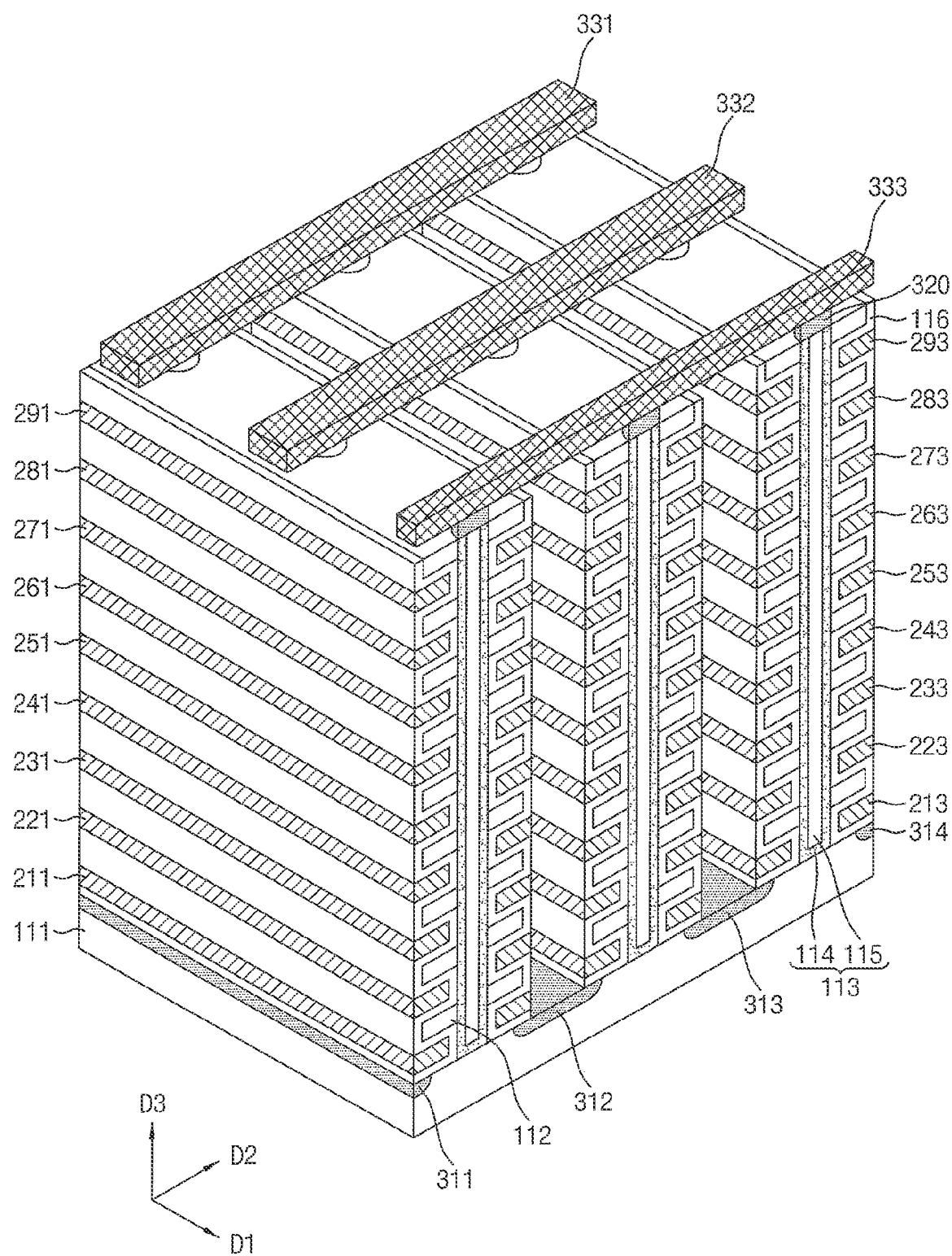
FIG. 5 is a perspective view illustrating one of a plurality of memory blocks of FIG. 4.

FIG. 4 is a block diagram illustrating a memory cell array included in the nonvolatile memory device of FIG. 3. FIG. 5 is a perspective view illustrating one of a plurality of memory blocks of FIG. 4.

Referring to FIG. 4, the memory cell array 100 may include a plurality of memory blocks BLK1 to BLKz, in which n is a natural number. In an embodiment, the memory blocks BLK1 to BLKz are selected by the address decoder 430 in FIG. 3. For example, the address decoder 430 may select a particular memory block BLK corresponding to a block address among the memory blocks BLK1 to BLKz.

Referring to FIG. 5, a memory block BLKi, which may correspond to one of the memory blocks BLK1 to BLKz of FIG. 4, includes NAND strings or cell strings which are formed on a substrate in a three-dimensional structure (or a vertical structure). The memory block BLKi includes structures extending along the first, second and third directions D1, D2 and D3.

A substrate 111 is provided. For example, the substrate 111 may have a well of a first type (e.g., a first conductive type). For example, the substrate 111 may have a p-well formed by implanting an element such as boron (B). For example, the substrate 111 may have a pocket p-well provided in an n-well. In an embodiment, the substrate 111 has a p-type well (or a p-type pocket well). However, the conductive type of the substrate 111 is not limited to the p-type. For example, in an embodiment, the conductive type of the substrate 111 may be an n-type.

A plurality of doping regions 311, 312, 313 and 314 extending along the first direction D1 are provided in/on the substrate 111. For example, the plurality of doping regions 311 to 314 may have a second type (e.g., a second conductive type) different from the first type of the substrate 111. In an embodiment, the first to fourth doping regions 311 to 314 have an n-type. However, the conductive type of the first to fourth doping regions 311 to 314 is not limited to the n-type. For example, in an embodiment, the conductive type of the first to fourth doping regions 311 to 314 may be a p-type.

A plurality of insulation materials 112 extending along the first direction D1 are sequentially provided along the second direction D2 on a region of the substrate 111 between the first and second doping regions 311 and 312. For example, the plurality of insulation materials 112 is provided along the second direction D2, being spaced by a specific distance. For example, the insulation materials 112 may include an insulation material such as an oxide layer.

A plurality of pillars 113 penetrating the insulation materials along the third direction D3 is sequentially disposed along the second direction D2 on a region of the substrate 111. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In an embodiment, the channel layer 114 of each pillar 113 includes p-type silicon. However, the channel layer 114 of each pillar 113 is not limited to the p-type silicon.

An internal material 115 of each pillar 113 includes an insulation material. For example, the internal material 115 of each pillar 113 may include an insulation material such as silicon oxide. In some examples, the internal material 115 of each pillar 113 may include an air gap.

An insulation layer 116 is provided along the exposed surfaces of the insulation materials 112, the pillars 113, and the substrate 111, on a region between the first and second doping regions 311 and 312.

A plurality of first conductive materials 211, 221, 231, 241, 251, 261, 271, 281 and 291 is provided on surfaces of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the first direction D1 is provided between the insulation layer 116 at the top of a specific insulation material among the insulation materials 112 and the insulation layer 116 at the bottom of a specific insulation material among the insulation materials 112. For example, a plurality of first conductive materials 221 to 281 extending along the first direction D1 is provided between the insulation materials 112. The insulation layer 116 is provided between the insulation materials 112 and the first conductive materials 221 to 281. The first conductive materials 211 to 291 may be formed of a conductive metal. In some examples, the first conductive materials 211 to 291 may include a conductive material such as, for example, polysilicon.

The same structures as those on the first and second doping regions 311 and 312 may be provided in a region between the second and third doping regions 312 and 313. In the region between the second and third doping regions 312 and 313, a plurality of insulation materials 112 extending along the first direction D1, a pillar 113 penetrating the plurality of insulation materials 112 along the third direction D3, an insulation layer 116 provided on the exposed surfaces of the plurality of insulation materials 112 and the pillar 113, and a plurality of conductive materials 213, 223, 233, 243, 253, 263, 273, 283 and 293 extending along the first direction D1 are provided.

Drains 320 are provided on the plurality of pillars 113, respectively. Second conductive materials 331, 332 and 333 extending along the second direction D2 are provided on the drains 320. The second conductive materials 331 to 333 are disposed along the first direction D1, being spaced by a specific distance. The second conductive materials 331 to 333 are respectively connected to the drains 320 in a corresponding region. The drains 320 and the second conductive material 333 extending along the second direction D2 may be connected through contact plugs. The second conductive materials 331 to 333 may include metal materials. The second conductive materials 331 to 333 may include conductive materials such as, for example, polysilicon.

The layers in which the first conductive materials 211 to 291 are formed correspond to gate layers and the first conductive materials 211 to 291 may form gate lines such as, for example, a string selection line SSL, a wordline WL, a ground selection line GSL, etc. The second conductive materials 331 to 333 may form a bitline BL.

Figure 6:
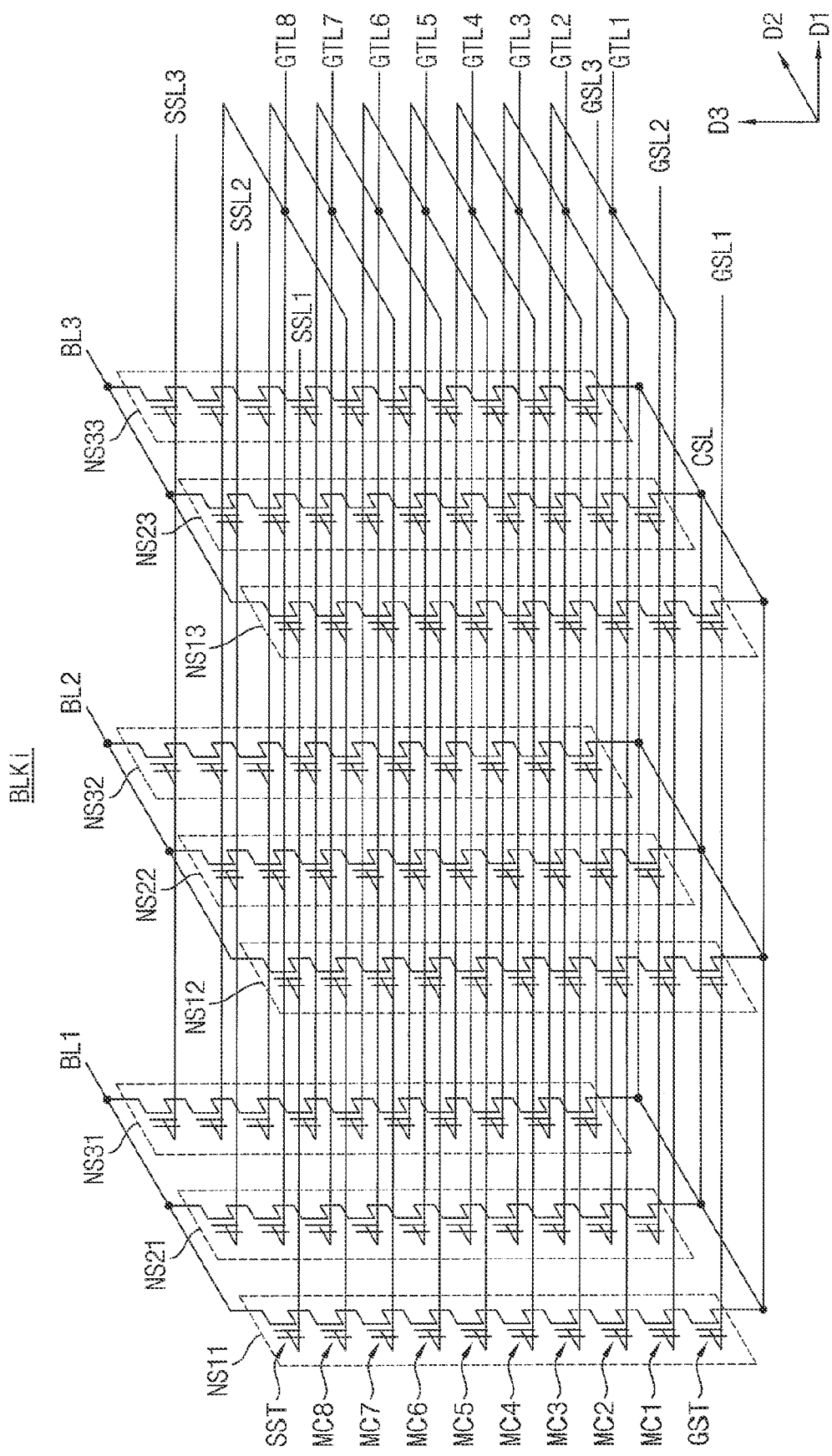
FIG. 6 is a diagram illustrating an equivalent circuit of one of the plurality of memory blocks of FIG. 4.

FIG. 6 is a diagram illustrating an equivalent circuit of one of the plurality of memory blocks of FIG. 4.

The memory block BLKi of FIG. 6, which may correspond to one of the memory blocks BLK1 to BLKz of FIG. 4, may be formed on a substrate in a three-dimensional structure (or a vertical structure). For example, NAND strings or cell strings included in the memory block BLKi may be formed in the third direction D3 perpendicular to the upper surface of the substrate.

Referring to FIG. 6, the memory block BLKi may include NAND strings NS11, NS21, NS311, NS12, NS22, NS32, NS13, NS23 and NS33 coupled between bitlines BL1, BL2 and BL3 and a common source line CSL. Each of the NAND strings NS11 to NS33 may include a string selection transistor SST, a memory cells MC1, MC2, MC3, MC4, MC5, MC6, MC7 and MC8, and a ground selection transistor GST. In FIG. 6, each of the NAND strings NS11 to NS33 is illustrated as including eight memory cells MC1 to MC8. However, example embodiments are not limited thereto. For example, in some example embodiments, each of the NAND strings NS11 to NS33 may include any number of memory cells.

Each string selection transistor SST may be connected to a corresponding string selection line (one of SSL1 to SSL3). The memory cells MC1 to MC8 may be connected to corresponding gate lines GTL1, GTL2, GTL3, GTL4, GTL5, GTL6, GTL7 and GTL8, respectively. The gate lines GTL1 to GTL8 may be wordlines, and some of the gate lines GTL1 to GTL8 may be dummy wordlines. Each ground selection transistor GST may be connected to a corresponding ground selection line (one of GSL1, GSL2 and GSL3). Each string selection transistor SST may be connected to a corresponding bitline (e.g., one of BL1, BL2 and BL3), and each ground selection transistor GST may be connected to the common source line CSL.

Wordlines (e.g., WL1) having the same height may be commonly connected, and the ground selection lines GSL1 to GSL3 and the string selection lines SSL1 to SSL3 may be separated.

In FIG. 6, the memory block BLKi is illustrated as being coupled to eight gate lines GTL1 to GTL8 and three bitlines BL1 to BL3. However, example embodiments are not limited thereto. For example, in some example embodiments, each memory block in the memory cell array may be coupled to any number of wordlines and any number of bitlines.

In FIG. 6, each cell string includes one string selection transistor SST and one ground selection transistor GST. However, example embodiments are not limited thereto. For example, in some example embodiments, each cell string may include two or more string selection transistors SST and one of the string selection transistors SST may be used as the GIDL transistor as described above. In some example embodiments, each cell string may include two or more ground selection transistors GST and one of the ground selection transistors GST may be used as the GIDL transistor as described above.

Hereinafter, example embodiments of a uni-directional channel precharge using at least a portion of a plurality of bitlines are described with reference to FIGS. 7 through 11.

Figure 7:
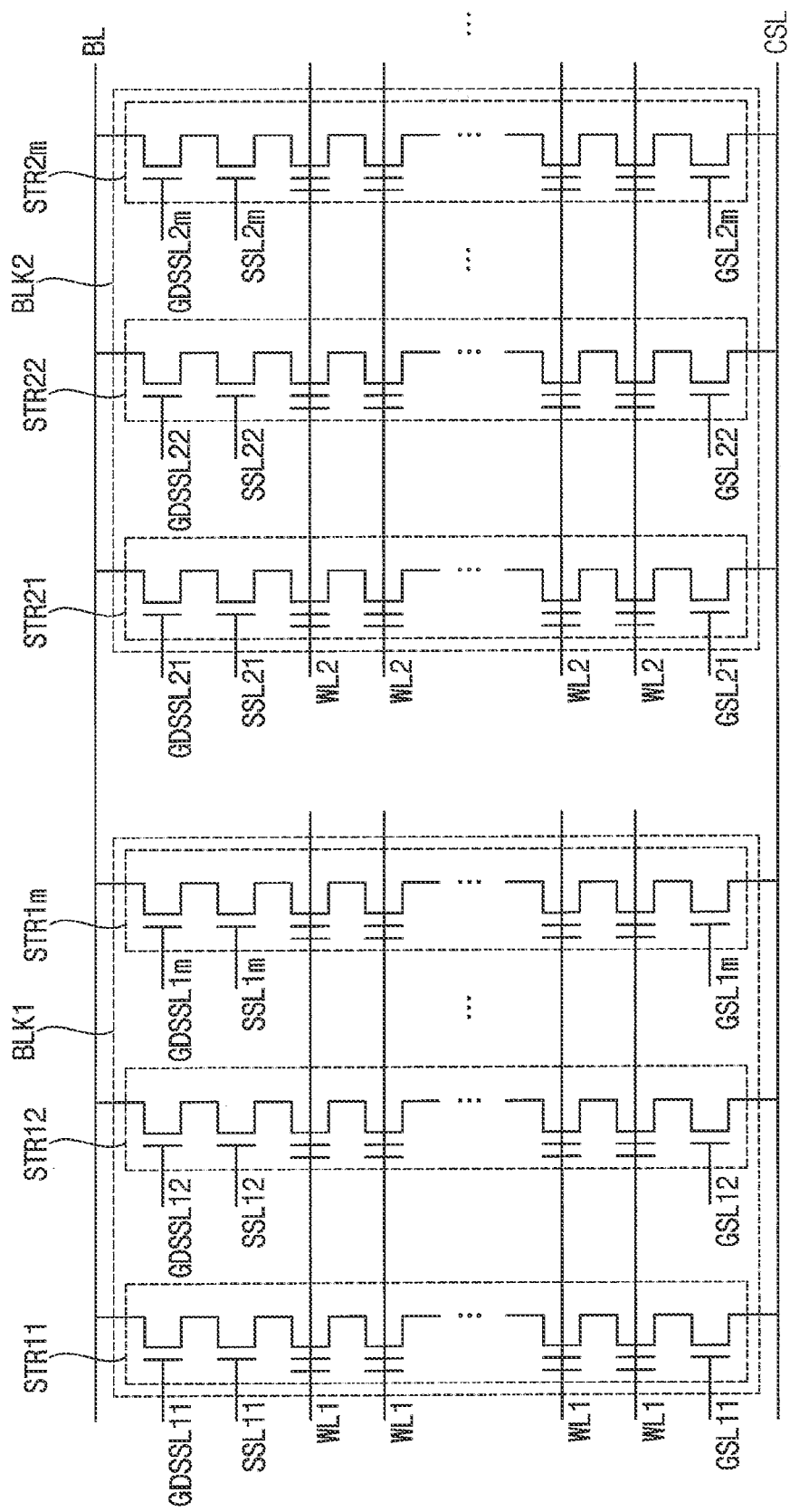
FIG. 7 is a circuit diagram illustrating an example embodiment of a memory cell array included in a nonvolatile memory device according to example embodiments.

FIG. 7 is a circuit diagram illustrating an example embodiment of a memory cell array included in a nonvolatile memory device according to example embodiments.

FIG. 7 illustrates a two-dimensional version of a memory block including cell strings connected to one bitline BL and one source line CSL for convenience of illustration. However, it will be understood that the memory block may have a three-dimensional structure of a plurality of bitlines as described with reference to FIGS. 5 and 6. In addition, FIG. 7 illustrates only two memory blocks BLK1 and BLK2 that are commonly connected to the bitline BL for convenience of illustration. However, it will be understood that three or more memory blocks may be commonly connected to the bitline.

Referring to FIG. 7, the memory blocks BLK1 and BLK2 may include a plurality of cell strings STR11, STR12, . . . STR1$m$ and STR21, STR22, . . . STR2$m$ commonly connected between a bitline BL and a source line CSL, in which m is a natural number. The cell strings STR11~STR1$m$ and STR21~STR2$m$ may include GIDL string selection transistors controlled by GIDL string selection lines GDSSL11, GDSSL12, . . . GDSSL1$m$ and GDSSL21, GDSSL22, . . . GDSSL2$m$, string selection transistors controlled by string selection lines SSL11, SSL12, . . . SSL1$m$ and SSL21, SSL22, . . . SSL2$m$, memory cells controlled by wordlines WL1 and WL2, and ground selection transistors controlled by ground selection lines GSL11, GSL12, . . . GSL1$m$ and GSL21, GSL22, . . . GSL2$m$, respectively.

The above-described GIDL transistors may include the GIDL string selection transistors connected to the bitline BL as illustrated in FIG. 7. The GIDL string selection lines GDSSL11~GDSSL1$m$ and GDSSL21~GDSSL2$m$ correspond to the gates of the GIDL string selection transistors.

As illustrated in FIG. 7, the first memory block BLK1 may be controlled by the wordlines W1 dedicated to the first memory block BLK1 and the second memory block BLK2 may be controlled by the wordlines W2 dedicated to the second memory block BLK2. Among a plurality of memory blocks, one memory block including memory cells to be programmed corresponds to the selected memory block and the other memory blocks correspond to the unselected memory blocks.

FIG. 7 illustrates an example embodiment in which the cell strings STR11~STR1$m$ and STR21~STR2$m$ are controlled by the respective ground selection lines GSL11~GSL1$m$ and GSL21~GSL2$m$. In some example embodiments, the cell strings in the same memory block may be controlled by a single ground selection line.

Figure 8:
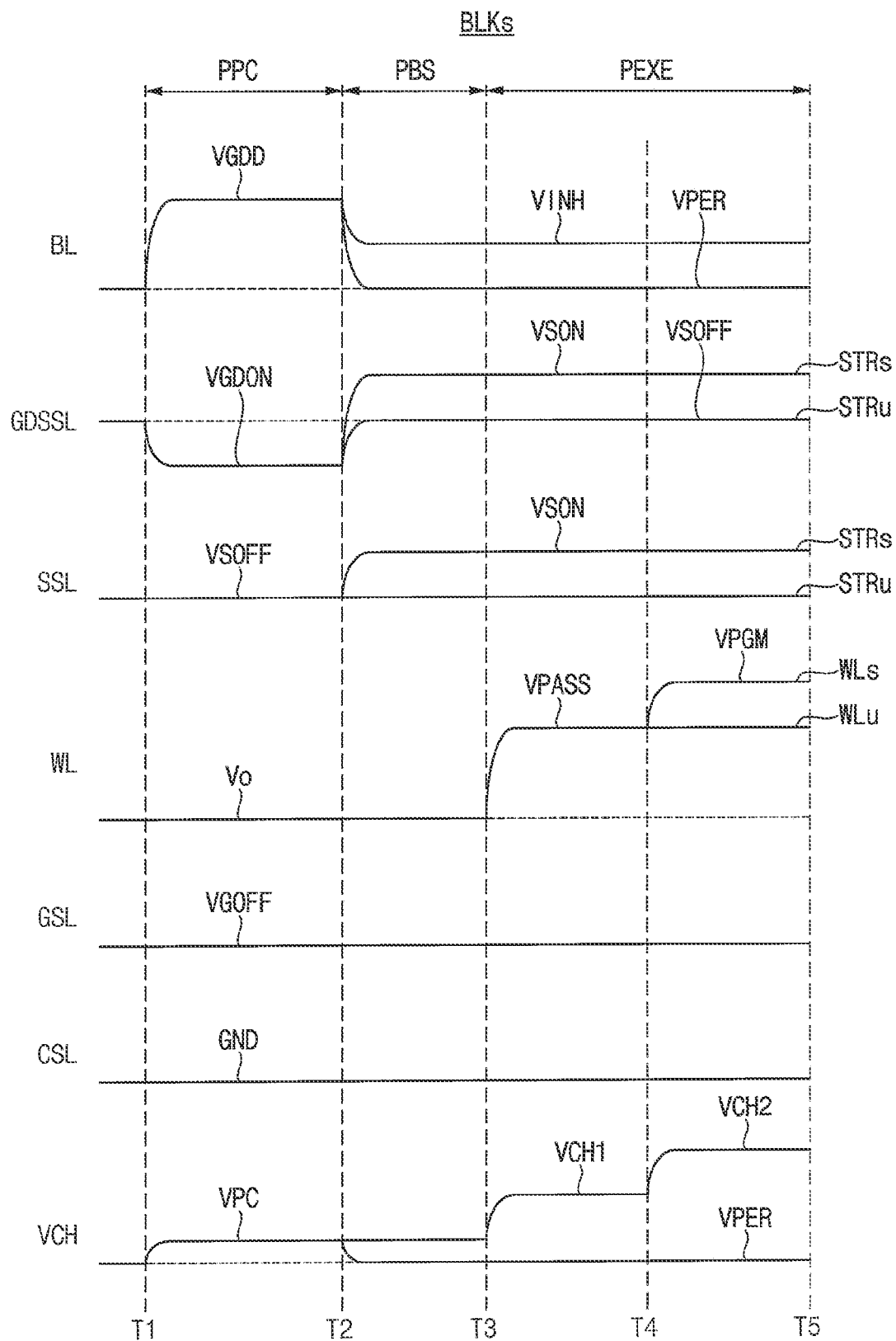
FIGS. 8, 9, 10 and 11 are timing diagrams illustrating a method of programming in a nonvolatile memory device including the memory cell array of FIG. 7.
Figure 9:
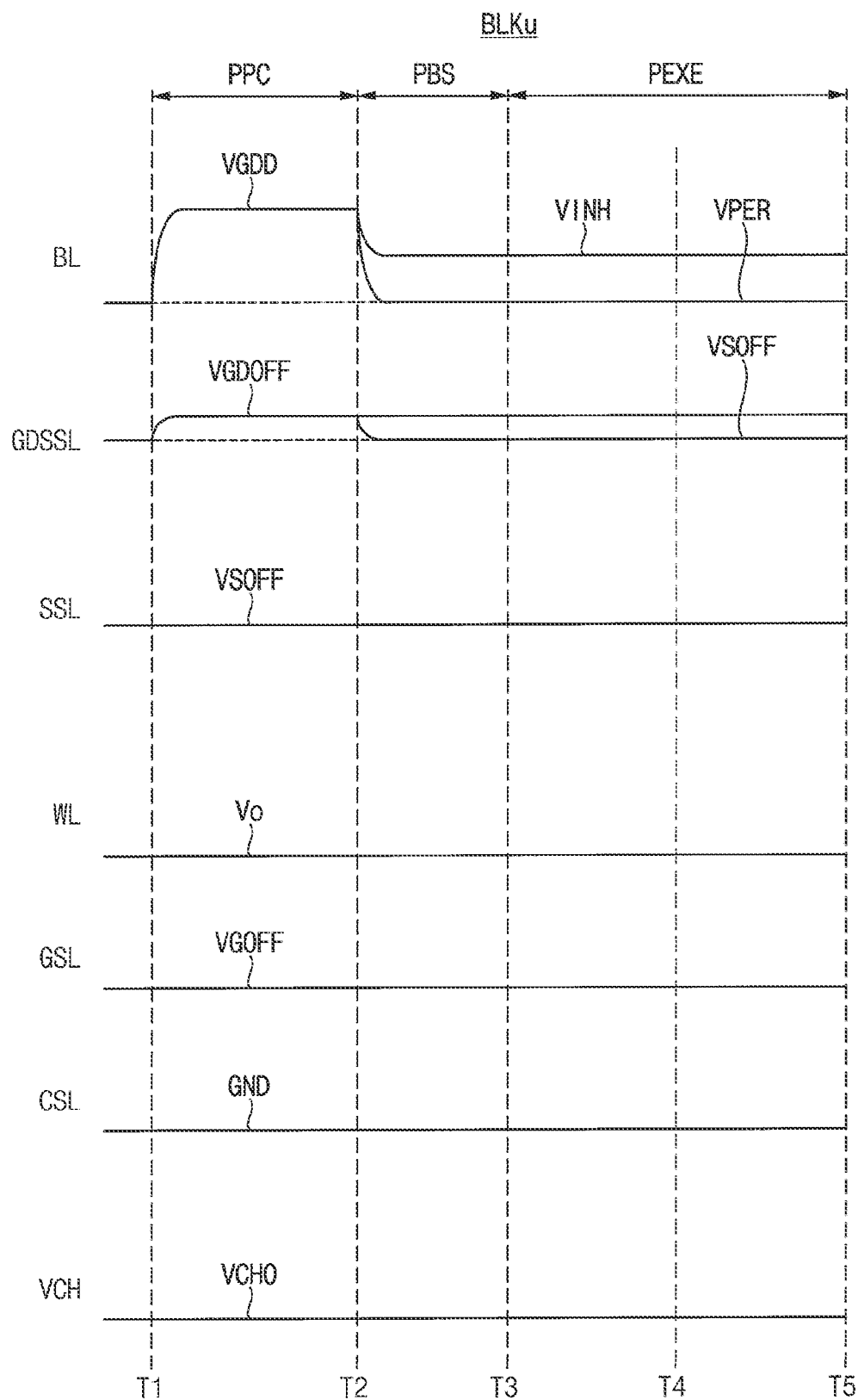
Figure 10:
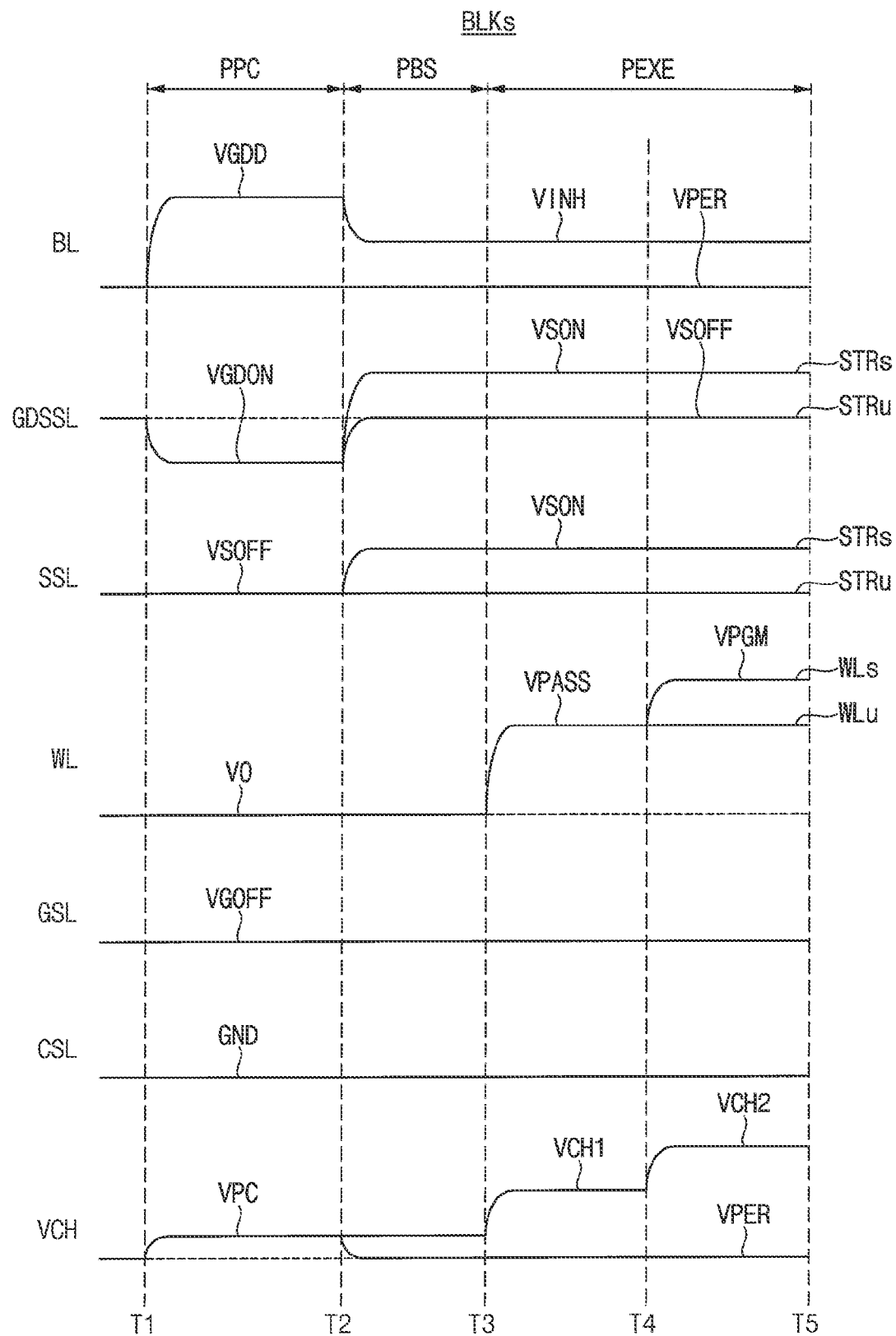
Figure 11:
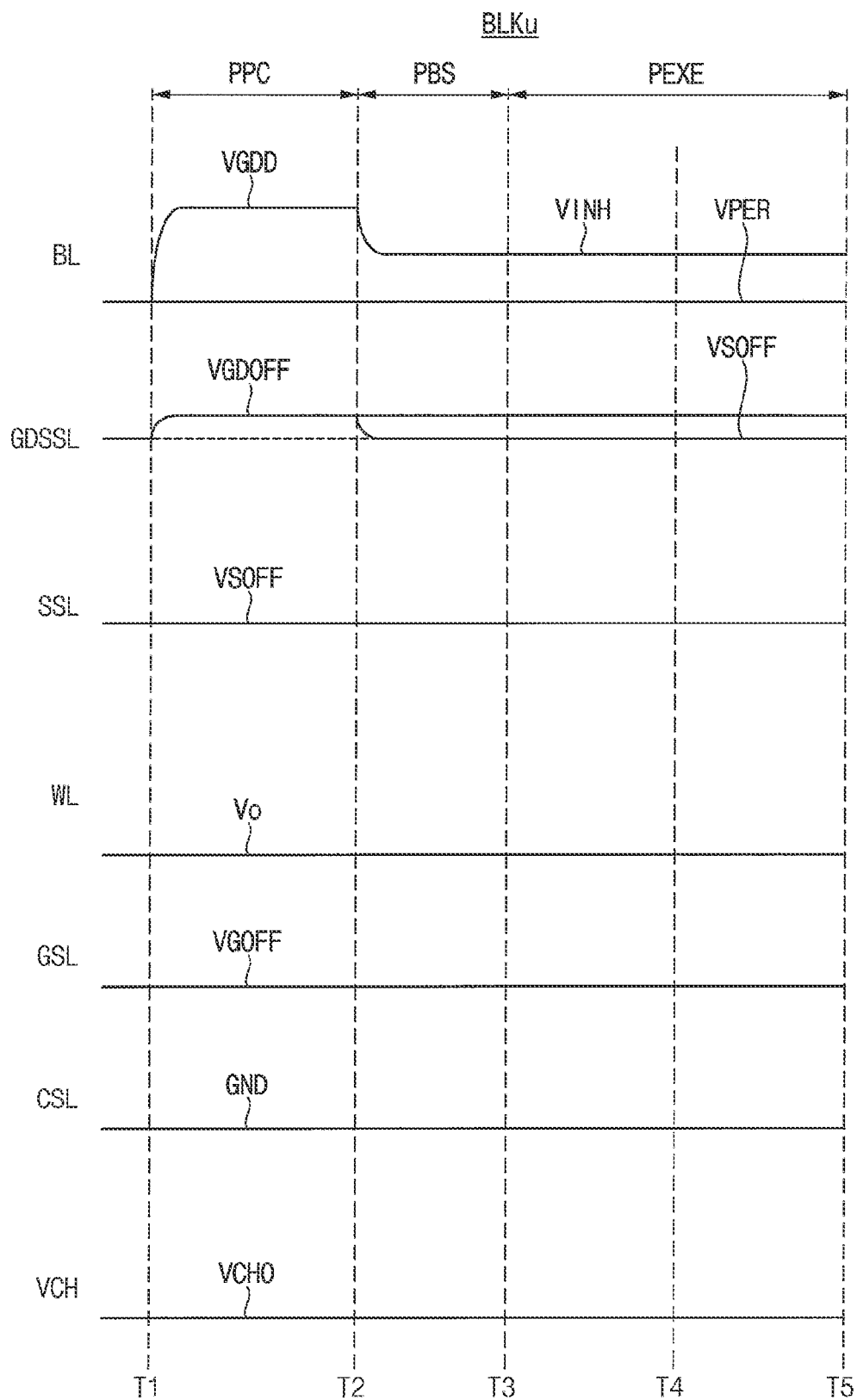

FIGS. 8 through 11 are timing diagrams illustrating a method of programming in a nonvolatile memory device including the memory cell array of FIG. 7. FIGS. 8 and 9 illustrate a 2-step GIDL unselected string initial precharge (USIP) operation, and FIGS. 10 and 11 illustrate a 1-step GIDL USIP operation.

In FIGS. 8 through 11, the time interval T1~T2 is a precharge period PPC to precharge a channel of cell strings, the time interval T2~T3 is bitline setup period PBS to set each bitline with a voltage corresponding to each program bit, and the time interval T3~T5 is a program execution period PEXE while a program voltage VPGM is applied to the selected wordline WLs. Hereinafter, a turn-on voltage and a turn-off voltage represent voltage levels to turn a corresponding transistor on and off.

FIG. 8 illustrates the 2-step GIDL USIP operation with respect to the selected memory block BLKs.

Referring to FIG. 8, during the precharge period PPC, a GIDL on voltage VGDON to induce the GIDL may be applied to the GIDL string selection line GDSSL, that is, the gates of the GIDL string selection transistors included in the cell strings of the selected memory block BLKs. As illustrated in FIG. 8, the GIDL on voltage VGDON may have a negative voltage level.

During the precharge period PPC, the GIDL drain voltage VGDD may be applied to a plurality of bitlines BL such that the GIDL drain voltage VGDD has a voltage level higher than a voltage difference VGDTH-VGDON between a GIDL threshold voltage VGDTH and the GIDL on voltage VGDON. The GIDL threshold voltage VGDTH indicates a minimum voltage difference between the drain voltage and the gate voltage to induce the GIDL. The GIDL threshold voltage may be determined depending on the configuration and the characteristics of the GIDL transistor. For example, if the GIDL threshold voltage is 6V and the GIDL on voltage VGDON is −1.5V, the GIDL drain voltage VGDD may have a voltage level higher than 7.5V (corresponding to 6−(−1.5) V).

During the precharge period PPC, a turn-off voltage VSOFF is applied to the string selection lines SSL, an initial wordline voltage Vo is applied to the wordlines WL, and a turn-off voltage VGOFF is applied to the ground selection lines GSL. The ground voltage GND may be applied to the source line CSL.

As such, a channel voltage VCH of the selected memory block BLKs may be precharged with a precharge voltage VPC during the precharge period PPC by performing the uni-directional channel precharge using the bitlines BL.

During the bitline setup period PBS, a program inhibition voltage VINH is applied to the bitlines BL corresponding to a program bit of a first value, and a program permission voltage VPER is applied to the bitlines BL corresponding to a program bit of a second value.

During the bitline setup period PBS, the turn-on voltage VSON is applied to the GIDL string selection line GDSSL and the string selection line SSL of the selected cell string STRs, and the turn-off voltage VSOFF is applied to the GIDL string selection line GDSSL and the string selection line SSL of the unselected cell string STRu. Accordingly, the GIDL string selection transistors and the string selection transistors of program permission cell strings are turned on and the channel voltage VCH of the program permission cell strings becomes the program permission voltage VPER. In contrast, the GIDL string selection transistors and the string selection transistors of program inhibition cell strings are turned off to float the channels and the channel voltage VCH of the program inhibition cell strings maintains the precharge voltage VPC. Here, a program permission cell string indicates the selected cell string connected to a bitline to which the program permission voltage VPER is applied, and a program inhibition cell string indicates the selected cell string STRs connected to a bitline to which the program inhibition voltage VINH is applied and all of the unselected cell strings STRu.

During a first time interval T3~T4 of the program execution period PEXE, a pass voltage VPASS is applied to all of the wordlines WLu and WLs of the selected memory block BLKs, and the channel voltage VCH of the program inhibition cell strings is booted to a first channel voltage VCH1. During a second time interval T4~T5 of the program execution period PEXE, the pass voltage VPASS is applied to all of the unselected wordlines WLu of the selected memory block BLKs, a program voltage VPGM is applied to one selected wordline WLs of the selected memory block BLKs, and the channel voltage VCH of the program inhibition cell strings is further booted to a second channel voltage VCH2. The second channel voltage VCH2 corresponds to a sufficiently high level to prevent the programming of the memory cells connected to the selected wordline WLs of the program inhibition cells strings. In contrast, the channel voltage VCH of the program permission cell strings maintains the program permission voltage VPER and the memory cells connected to the selected wordline WLs of the program permission cell strings may be programmed.

FIG. 9 illustrates the 2-step GIDL USIP operation with respect to the unselected memory block BLKu.

The voltages of the bitlines BL, the ground selection line GSL and the source line CSL of FIG. 9 are the same as FIG. 8. Thus, for convenience of explanation, a repeated description thereof is omitted.

Referring to FIG. 9, during the precharge period PPC, a GIDL off voltage VGDOFF to prevent the GIDL may be applied to the GIDL string selection line GDSSL, that is, gates of the GIDL transistors included in the cell strings of the unselected memory block BLKu. The GIDL off voltage VGDOFF may have a positive voltage level higher than the GIDL on voltage as described above with reference to FIG. 8. The GIDL off voltage VGDOFF may have the voltage level higher than the voltage difference VGDD-VGDTH between the GIDL drain voltage VGDD and the GIDL threshold voltage VGDTH. For example, if the GIDL threshold voltage VGDTH is 6V and the GIDL drain voltage VGDD is 7.5V, the GIDL off voltage VGDOFF may have a voltage level higher than 1.5V (corresponding to 7.5-6V).

In some example embodiments, during the precharge period PPC, the gates of the GIDL transistors, that is, the GIDL string selection line GDSSL, included in the cell strings of the unselected memory block BLKu may be floated. In this case, during the precharge period PPC, the gate voltage of the GIDL transistors included in the cell strings of the unselected memory block BLKu, that is, the voltage of the GIDL string selection line GDSSL, may be boosted to the GIDL off voltage to prevent the GIDL by the GIDL drain voltage VGDD applied to the drains of the GIDL transistors through the bitlines BL.

During the bitline setup period PBS, the turn-off voltage VSOFF is applied to all of the GIDL string selection lines GDSSL and the string selection lines SSL of the unselected memory block BLKu. In some example embodiments, during the bitline setup period PBS, all of the GIDL string selection lines GDSSL of the unselected memory block BLKu may maintain the GIDL off voltage VGDOFF.

During the precharge period PPC, the bitline setup period PBS and the program execution period PEXE, the initial wordline voltage Vo may be applied to all of the wordlines WL of the unselected memory block BLKu. In some example embodiments, during the precharge period PPC, the bitline setup period PBS and the program execution period PEXE, all of the wordlines of the unselected memory block BLKu may be floated.

As a result, the channel voltage VCH of the cell strings of the unselected memory block BLKu may maintain an initial channel voltage VCH0 during the precharge period PPC, the bitline setup period PBS and the program execution period PEXE.

As described with reference to FIGS. 8 and 9, the precharge of the unselected memory block BLKu may be prevented while the channels of the selected memory block BLKs are precharged, and thus, the soft erase of the unselected memory block BLKu may be reduced or prevented.

FIG. 10 illustrates the 1-step GIDL USIP operation with respect to the selected memory block BLKs, and FIG. 11 illustrates the 1-step GIDL USIP operation with respect to the unselected memory block BLKu. The voltages of FIGS. 10 and 11 are substantially the same as those of FIGS. 8 and 9 except for the timings of applying the program inhibition voltage VINH and the program permission voltage VPER to the bitlines BL. Thus, for convenience of explanation, a repeated description thereof is omitted.

Referring to FIGS. 10 and 11, during the precharge period PPC, the GIDL drain voltage VGDD may be applied to the bitlines BL corresponding to the program bit of the first value such that the GIDL drain voltage VGDD has a voltage level higher than a voltage difference VGDTH-VGDON between a GIDL threshold voltage VGDTH and the GIDL on voltage VGDON. During the bitline setup period PBS between the precharge period PPC and the program execution period PEXE, the program inhibition voltage VINH may be applied to the bitlines BL corresponding to the program bit of the first value. During the bitline setup period PBS, the program permission voltage VPER may be applied to the bitlines BL corresponding to the program bit of the second value.

Hereinafter, example embodiments of a uni-directional channel precharge using a source line are described with reference to FIGS. 12 through 16.

Figure 12:
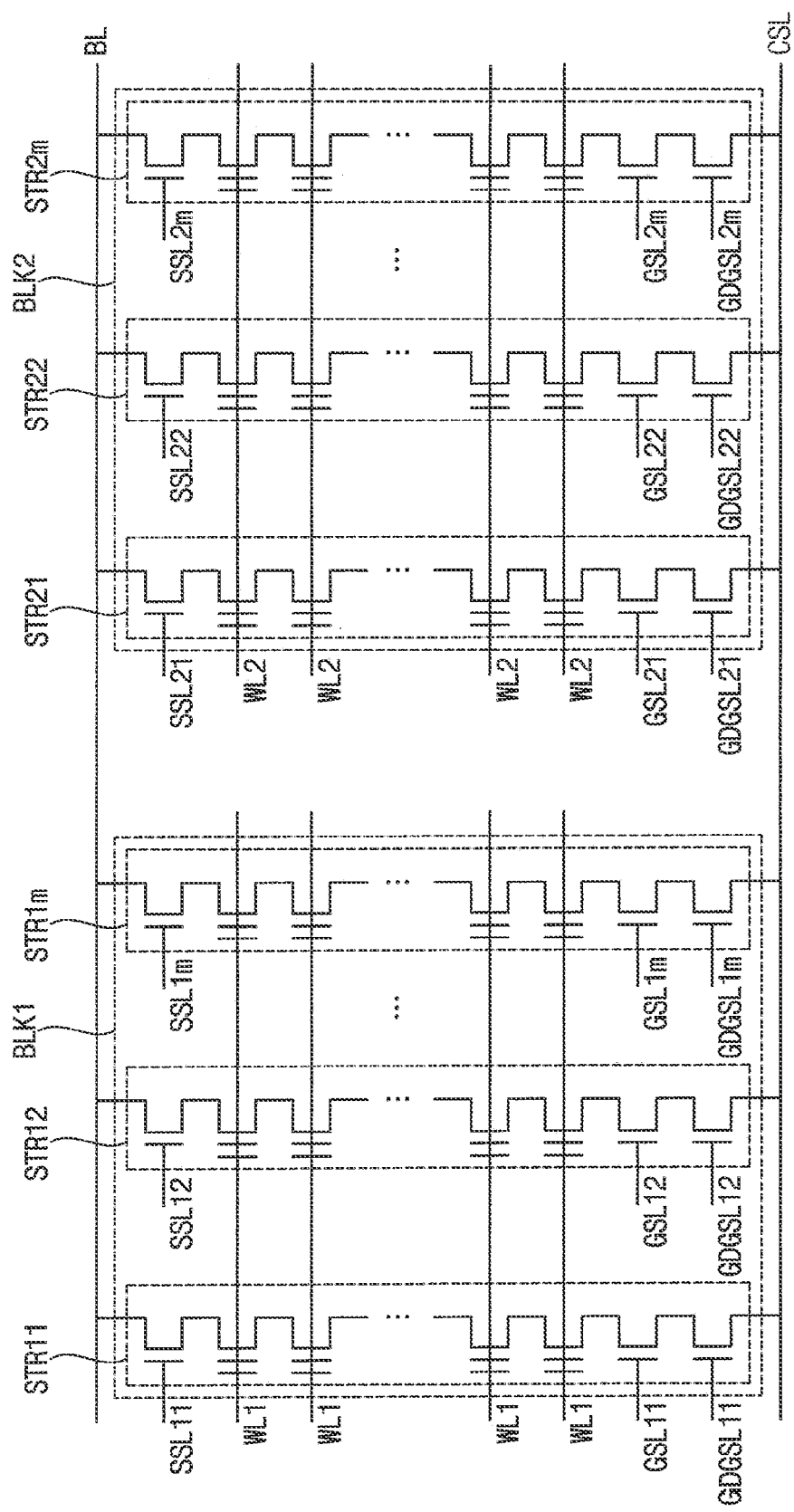
FIG. 12 is a circuit diagram illustrating an example embodiment of a memory cell array included in a nonvolatile memory device according to example embodiments.

FIG. 12 is a circuit diagram illustrating an example embodiment of a memory cell array included in a nonvolatile memory device according to example embodiments.

FIG. 12 illustrates a two-dimensional version of a memory block including cell strings connected to one bitline BL and one source line CSL for convenience of illustration. However, it will be understood that the memory block may have a three-dimensional structure of a plurality of bitlines as described with reference to FIGS. 5 and 6. In addition, although FIG. 12 illustrates only two memory blocks BLK1 and BLK2 that are commonly connected to the bitline BL for convenience of illustration, it will be understood that three or more memory blocks may be commonly connected to the bitline.

Referring to FIG. 12, the memory blocks BLK1 and BLK2 may include a plurality of cell strings STR11, STR12, . . . STR1m and STR21, STR22 . . . STR2m commonly connected between a bitline BL and a source line CSL, in which m is a natural number. The cell strings STR11~STR1m and STR21~STR2m may include string selection transistors controlled by string selection lines SSL11, SSL12, . . . SSL1m and SSL21, SSL22, . . . SSL2m, memory cells controlled by wordlines WL1 and WL2, ground selection transistors controlled by ground selection lines GSL11, GSL12, . . . GSL1m and GSL21, GSL22, . . . GSL2m, and GIDL ground selection transistors controlled by GIDL ground selection lines GDGSL11, GDGSL12, . . . GDGSL1m and GDGSL21, GDGSL22, . . . GDGSL2m, respectively.

The above-described GIDL transistors may include the GIDL ground selection transistors connected to the source line CSL as illustrated in FIG. 12. The GIDL ground selection lines GDGSL11~GDGSL1m and GDGSL21~GDGSL2m correspond to the gates of the GIDL ground selection transistors.

As illustrated in FIG. 12, the first memory block BLK1 may be controlled by the wordlines WL1 dedicated to the first memory block BLK1, and the second memory block BLK2 may be controlled by the wordlines WL2 dedicated to the second memory block BLK2. Among a plurality of memory blocks, one memory block including memory cells to be programmed corresponds to the selected memory block and the other memory blocks correspond to the unselected memory blocks.

Figure 13:
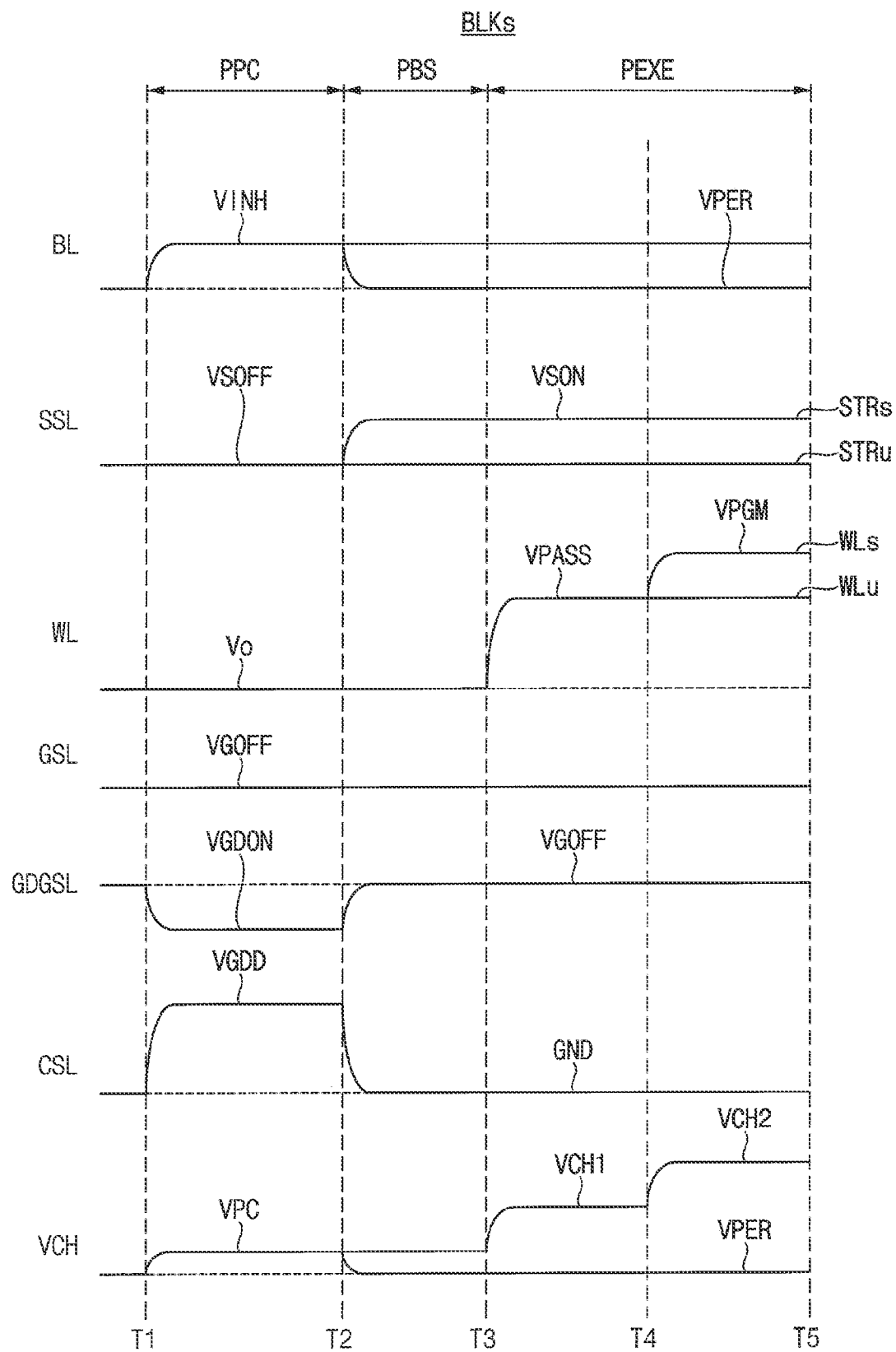
FIGS. 13, 14, 15 and 16 are timing diagrams illustrating a method of programming in a nonvolatile memory device including the memory cell array of FIG. 12.
Figure 14:
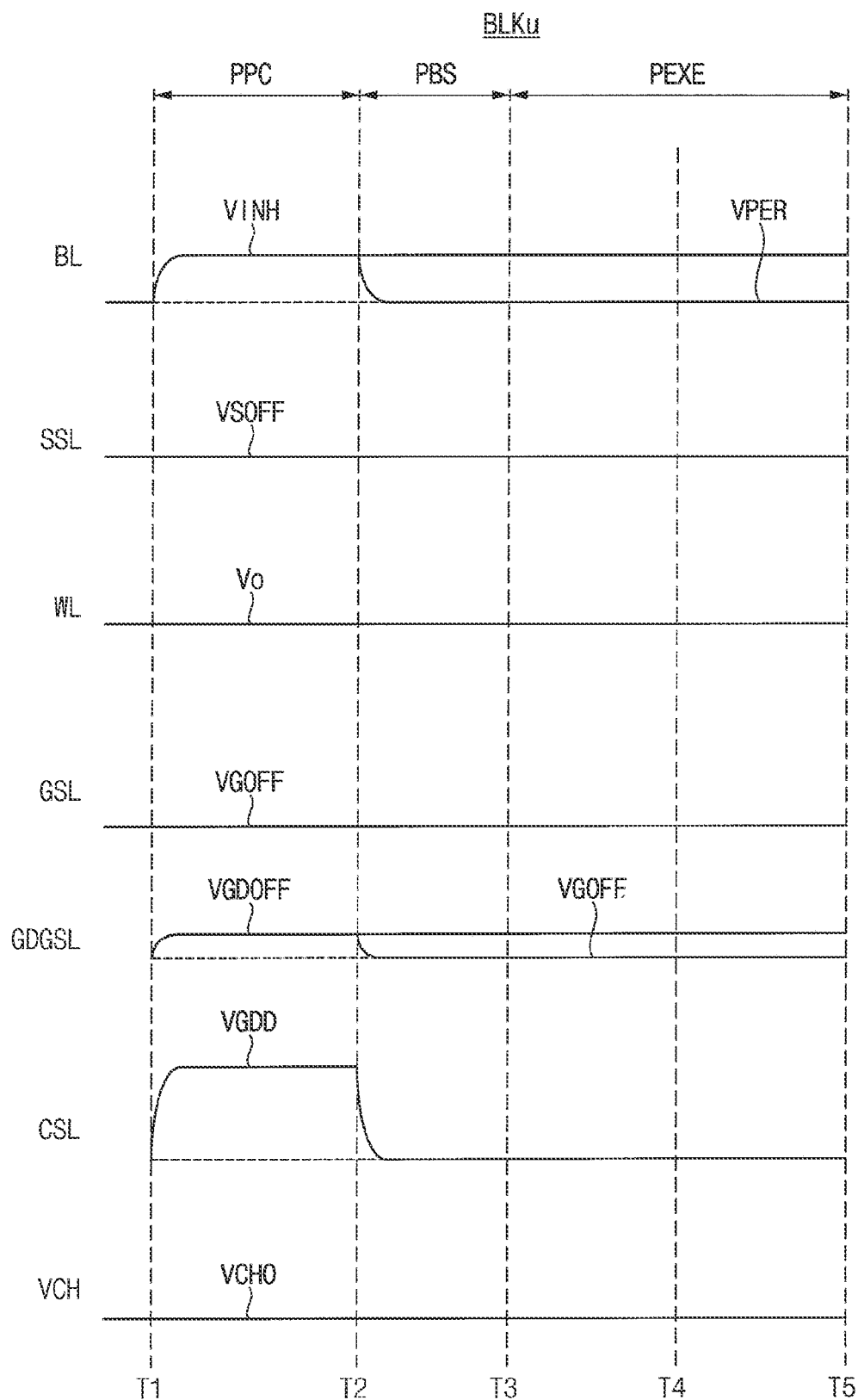
Figure 15:
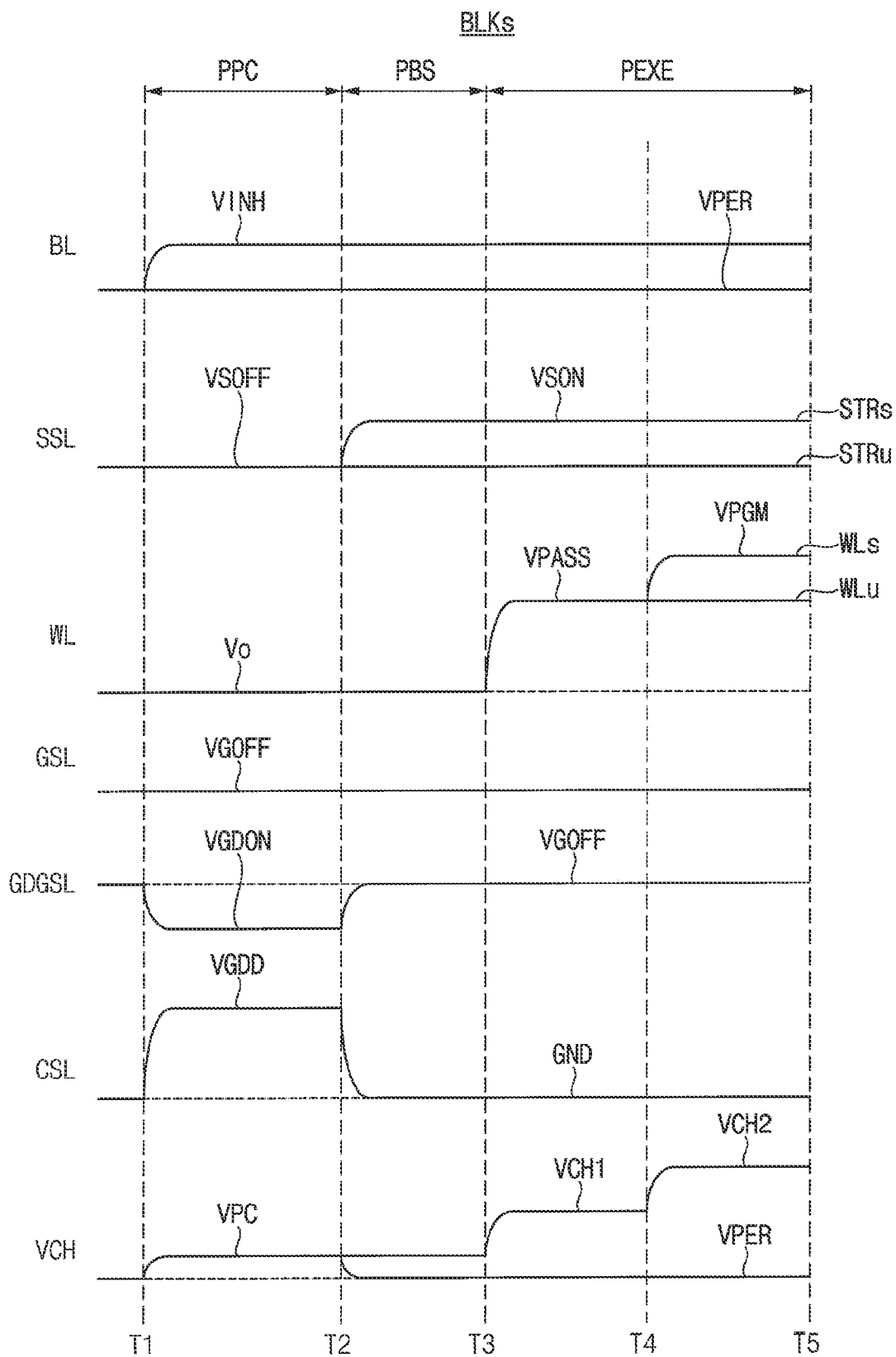
Figure 16:
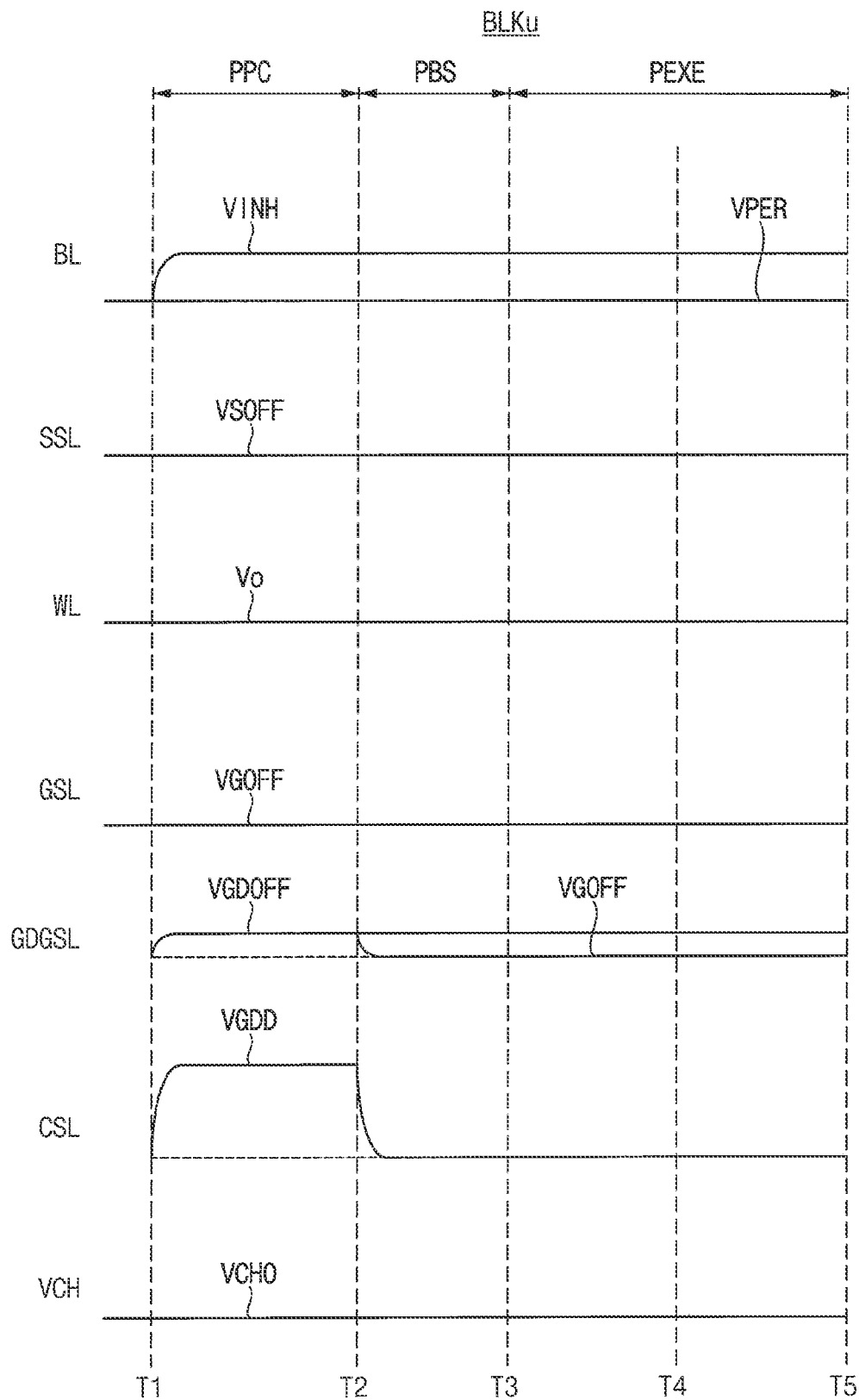

FIGS. 13 through 16 are timing diagrams illustrating a method of programming in a nonvolatile memory device including the memory cell array of FIG. 12. FIGS. 13 and 14 illustrate the 2-step GIDL USIP operation, and FIGS. 15 and 16 illustrate the 1-step GIDL USIP operation.

In FIGS. 13 through 16, the time interval T1~T2 is a precharge period PPC to precharge a channel of cell strings, the time interval T2~T3 is bitline setup period PBS to set each bitline with a voltage corresponding to each program bit, and the time interval T3~T5 is a program execution period PEXE while a program voltage VPGM is applied to the selected wordline WLs. Hereinafter, a turn-on voltage and a turn-off voltage represent voltage levels to turn a corresponding transistor on and off.

FIG. 13 illustrates the 2-step GIDL USIP operation with respect to the selected memory block BLKs.

Referring to FIG. 13, during the precharge period PPC, a GIDL on voltage VGDON to induce the GIDL may be applied to the GIDL ground selection line GDGSL, that is, the gates of the GIDL ground selection transistors included in the cell strings of the selected memory block BLKs. As illustrated in FIG. 13, the GIDL on voltage VGDON may have a negative voltage level.

During the precharge period PPC, the GIDL drain voltage VGDD may be applied to the source line such that the GIDL drain voltage VGDD has a voltage level higher than a voltage difference VGDTH-VGDON between a GIDL threshold voltage VGDTH and the GIDL on voltage VGDON. The GIDL threshold voltage VGDTH indicates a minimum voltage difference between the drain voltage and the gate voltage to induce the GIDL. The GIDL threshold voltage may be determined depending on the configuration and the characteristics of the GIDL transistor. For example, if the GIDL threshold voltage is 6V and the GIDL on voltage VGDON is −1.5V, the GIDL drain voltage VGDD may have a voltage level higher than 7.5V (corresponding to 6−(−1.5) V).

During the precharge period PPC, a turn-off voltage VSOFF is applied to the string selection lines SSL, an initial wordline voltage Vo is applied to the wordlines WL, and a program inhibition voltage VINH may be applied to the bitlines BL.

As such, a channel voltage VCH of the selected memory block BLKs may be precharged with a precharge voltage VPC during the precharge period PPC by performing the uni-directional channel precharge using the source line CSL.

The operations during the bitline setup period PBS and the program execution period PEXE are the same as FIG. 8. Thus, for convenience of explanation, a repeated description thereof is omitted.

FIG. 14 illustrates the 2-step GIDL USIP operation with respect to the unselected memory block BLKu.

The voltages of the bitlines BL, the ground selection line GSL and the source line CSL of FIG. 14 are the same as FIG. 13. Thus, for convenience of explanation, a repeated description thereof is omitted.

Referring to FIG. 14, during the precharge period PPC, a GIDL off voltage VGDOFF to prevent the GIDL may be applied to the GIDL ground selection line GDGSL, that is, gates of the GIDL transistors included in the cell strings of the unselected memory block BLKu. The GIDL off voltage VGDOFF may have a positive voltage level higher than the GIDL on voltage as described above with reference to FIG. 13. The GIDL off voltage VGDOFF may have the voltage level higher than the voltage difference VGDD-VGDTH between the GIDL drain voltage VGDD and the GIDL threshold voltage VGDTH. For example, if the GIDL threshold voltage VGDTH is 6V and the GIDL drain voltage VGDD is 7.5V, the GIDL off voltage VGDOFF may have a voltage level higher than 1.5V (corresponding to 7.5-6V).

In some example embodiments, during the precharge period PPC, the gates of the GIDL transistors, that is, the GIDL ground selection line GDGSL, included in the cell strings of the unselected memory block BLKu may be floated. In this case, during the precharge period PPC, the gate voltage of the GIDL transistors included in the cell strings of the unselected memory block BLKu, that is, the voltage of the GIDL ground selection line GDGSL, may be boosted to the GIDL off voltage to prevent or reduce the GIDL by the GIDL drain voltage VGDD applied to the drains of the GIDL transistors through the source line CSL.

The operations during the bitline setup period PBS and the program execution period PEXE are the same as FIG. 9. Thus, for convenience of explanation, a repeated description thereof is omitted.

As described with reference to FIGS. 13 and 14, the precharge of the unselected memory block BLKu may be prevented while the channels of the selected memory block BLKs are precharged, and thus, the soft erase of the unselected memory block BLKu may be reduced or prevented.

FIG. 15 illustrates the 1-step GIDL USIP operation with respect to the selected memory block BLKs, and FIG. 16 illustrates the 1-step GIDL USIP operation with respect to the unselected memory block BLKu. The voltages of FIGS. 15 and 16 are substantially the same as FIGS. 13 and 14 except for the timings of applying the program inhibition voltage VINH and the program permission voltage VPER to the bitlines BL. Thus, for convenience of explanation, a repeated description thereof is omitted.

Referring to FIGS. 15 and 16, during the precharge period PPC and the bitline setup period PBS, the program inhibition voltage VINH may be applied to the bitlines BL corresponding to the program bit of the first value. In addition, during the precharge period PPC and the bitline setup period PBS, the program permission voltage VPER may be applied to the bitlines BL corresponding to the program bit of the second value.

Hereinafter, example embodiments of a bi-directional channel precharge using at least a portion of a plurality of bitlines and a source line are described with reference to FIGS. 17 through 21.

Figure 17:
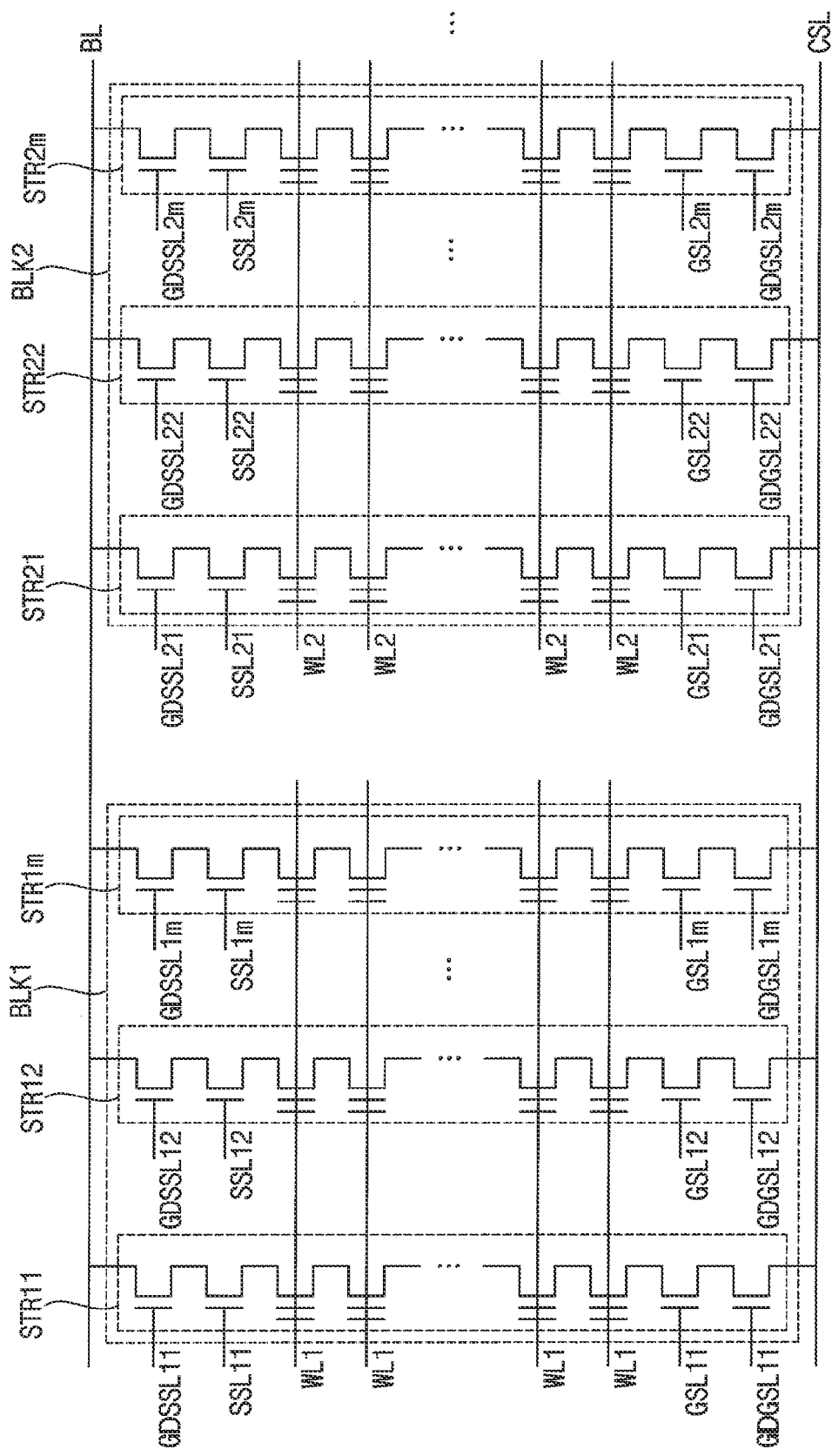
FIG. 17 is a circuit diagram illustrating an example embodiment of a memory cell array included in a nonvolatile memory device according to example embodiments.

FIG. 17 is a circuit diagram illustrating an example embodiment of a memory cell array included in a nonvolatile memory device according to example embodiments.

FIG. 17 illustrates a two-dimensional version of a memory block including cell strings connected to one bitline BL and one source line CSL for convenience of illustration. However, it will be understood that the memory block may have a three-dimensional structure of a plurality of bitlines as described with reference to FIGS. 5 and 6. In addition, although FIG. 17 illustrates only two memory blocks BLK1 and BLK2 that are commonly connected to the bitline BL for convenience of illustration, it will be understood that three or more memory blocks may be commonly connected to the bitline.

Referring to FIG. 17, the memory blocks BLK1 and BLK2 may include a plurality of cell strings STR11, STR12, ... STR1m and STR21, STR22, ... STR2m commonly connected between a bitline BL and a source line CSL, in which m is a natural number. The cell strings STR11~STR1m and STR21~STR2m may include GIDL string selection transistors controlled by GIDL string selection lines GDSSL11, GDSSL12, ... GDSSL1m and GDSSL21, GDSSL21, ... GDSSL2m, string selection transistors controlled by string selection lines SSL11~SSL1m and SSL21~SSL2m, memory cells controlled by wordlines WL1 and WL2, ground selection transistors controlled by ground selection lines GSL11, GSL12, ... GSL1m and GSL21, GSL22, ... GSL2m, and GIDL ground selection transistors controlled by GIDL ground selection lines GDGSL11, GDGSL12, ... GDGSL1m and GDGSL21, GDGSL22, ... GDGSL2m, respectively.

The above-described GIDL transistors may include the GIDL string selection transistors connected to the bitlines BL and the GIDL ground selection transistors connected to the source line CSL as illustrated in FIG. 17. The GIDL string selection lines GDSSL11~GDSSL1m and GDSSL21~GDSSL2m correspond to the gates of the GIDL string selection transistors, and the GIDL ground selection lines GDGSL11~GDGSL1m and GDGSL21~GDGSL2m correspond to the gates of the GIDL ground selection transistors.

As illustrated in FIG. 17, the first memory block BLK1 may be controlled by the wordlines WL1 dedicated to the first memory block BLK1 and the second memory block BLK2 may be controlled by the wordlines WL2 dedicated to the second memory block BLK2. Among a plurality of memory blocks, one memory block including memory cells to be programmed corresponds to the selected memory block and the other memory blocks correspond to the unselected memory blocks.

Figure 18:
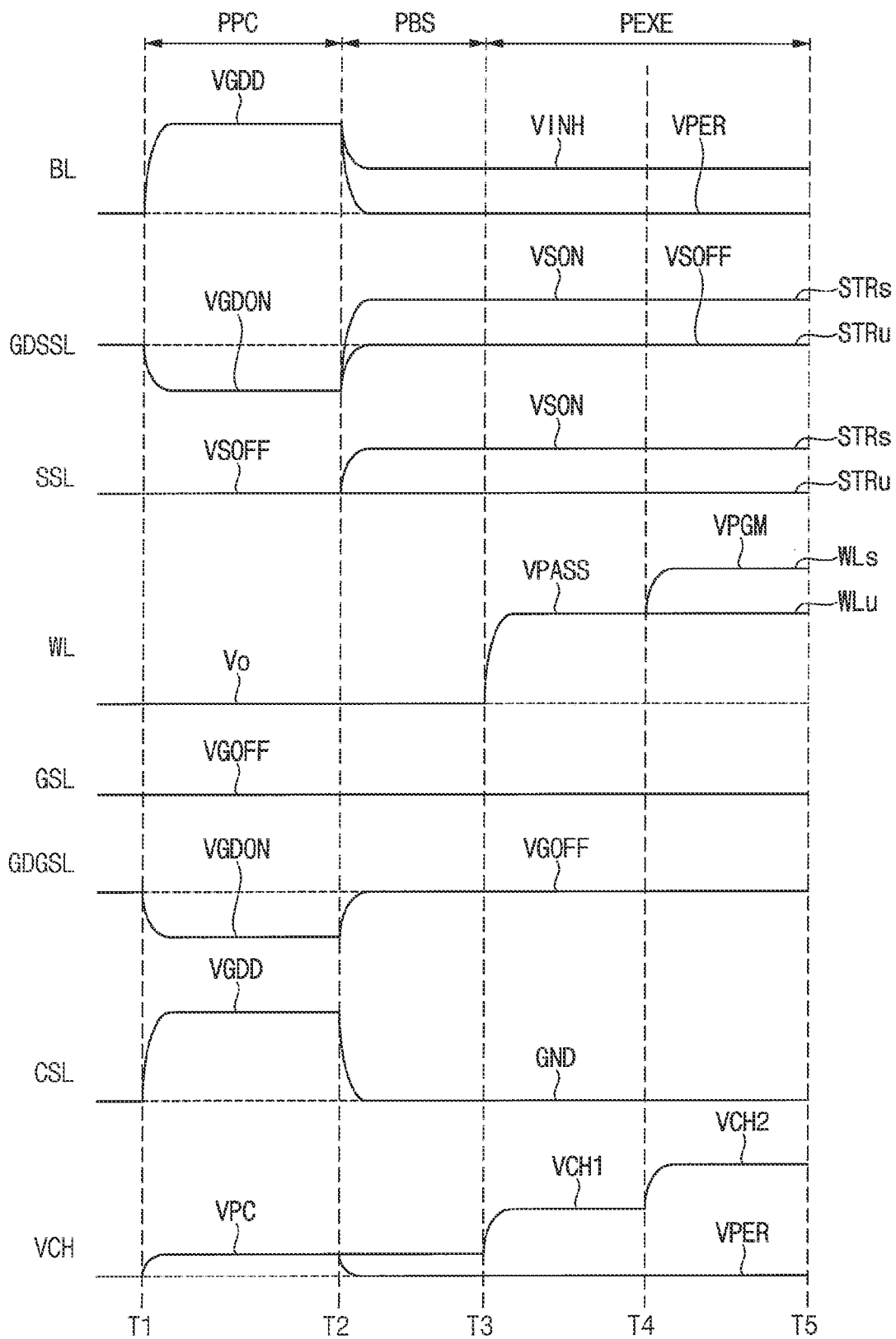
FIGS. 18, 19, 20 and 21 are timing diagrams illustrating a method of programming in a nonvolatile memory device including the memory cell array of FIG. 17.
Figure 19:
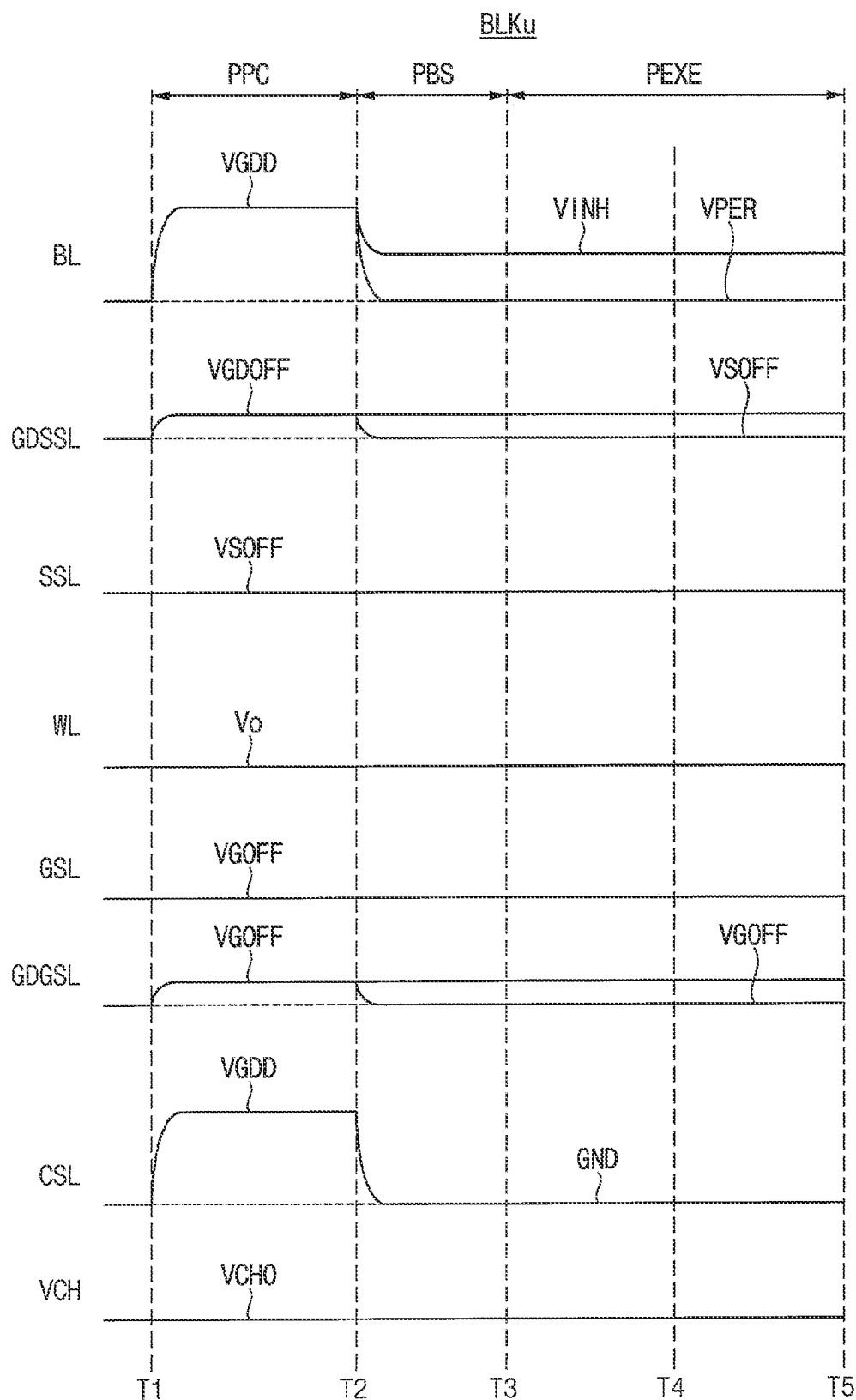
Figure 20:
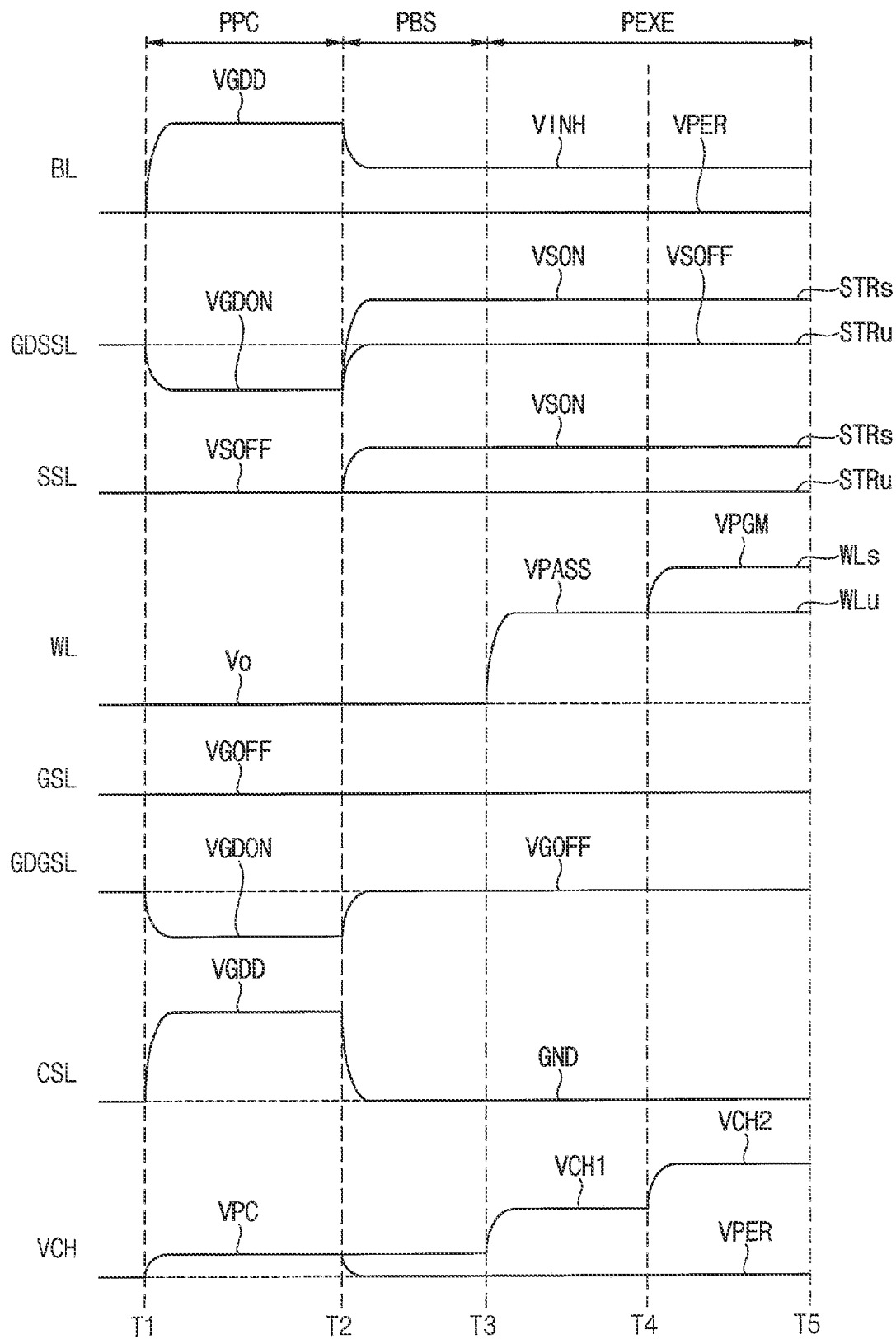
Figure 21:
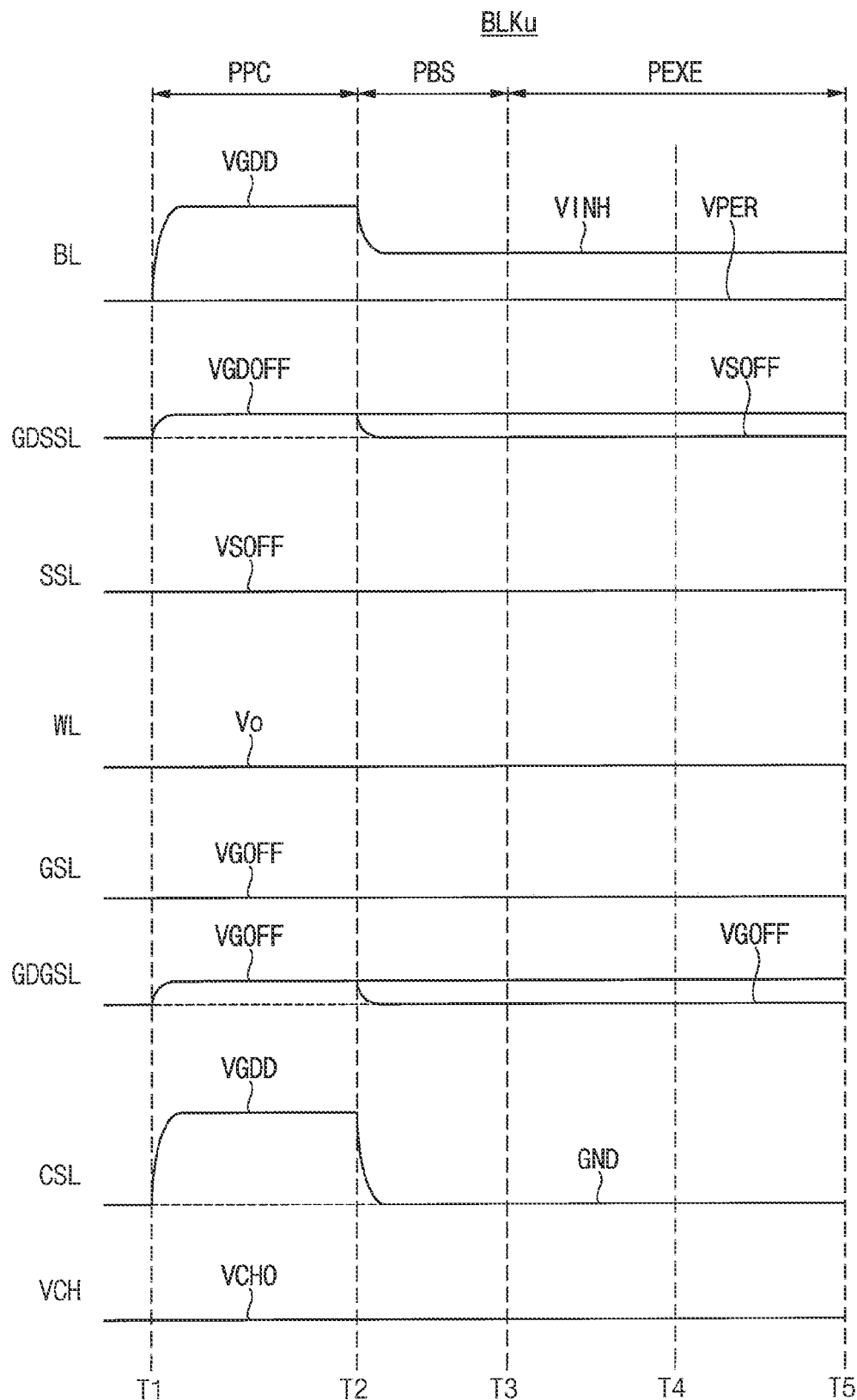

FIGS. 18 through 21 are timing diagrams illustrating a method of programming in a nonvolatile memory device including the memory cell array of FIG. 17. FIGS. 18 and 19 illustrate a 2-step GIDL unselected string initial precharge (USIP) operation, and FIGS. 20 and 21 illustrate a 1-step GIDL USIP operation.

FIG. 18 illustrates the 2-step GIDL USIP operation with respect to the selected memory block BLKs. The bi-directional channel precharge operation using the bitline and the source line of FIG. 18 is a combination of the uni-directional channel precharge using the bitline of FIG. 8 and the uni-directional channel precharge using the source line of FIG. 13. Thus, for convenience of explanation, a repeated description of elements and technical aspects previously described will be omitted.

FIG. 19 illustrates the 2-step GIDL USIP operation with respect to the unselected memory block BLKu. The precharge preventing operation of FIG. 19 is a combination of the precharge preventing operation of FIG. 9 and the precharge preventing operation of FIG. 14. Thus, for convenience of explanation, a repeated description of elements and technical aspects previously described will be omitted.

FIG. 20 illustrates the 1-step GIDL USIP operation with respect to the selected memory block BLKs. The bi-directional channel precharge operation using the bitline and the source line of FIG. 20 is a combination of the uni-directional channel precharge using the bitline of FIG. 10 and the uni-directional channel precharge using the source line of FIG. 15. Thus, for convenience of explanation, a repeated description of elements and technical aspects previously described will be omitted.

FIG. 21 illustrates the 1-step GIDL USIP operation with respect to the unselected memory block BLKu. The precharge preventing operation of FIG. 21 is a combination of the precharge preventing operation of FIG. 11 and the precharge preventing operation of FIG. 16. Thus, for convenience of explanation, a repeated description of elements and technical aspects previously described will be omitted.

As described above, the nonvolatile memory device and the method of programming in the nonvolatile memory device according to example embodiments may prevent or reduce the soft erase of the unselected memory block by preventing the precharge of the unselected memory block while precharging the channels of the selected memory block.

Figure 22:
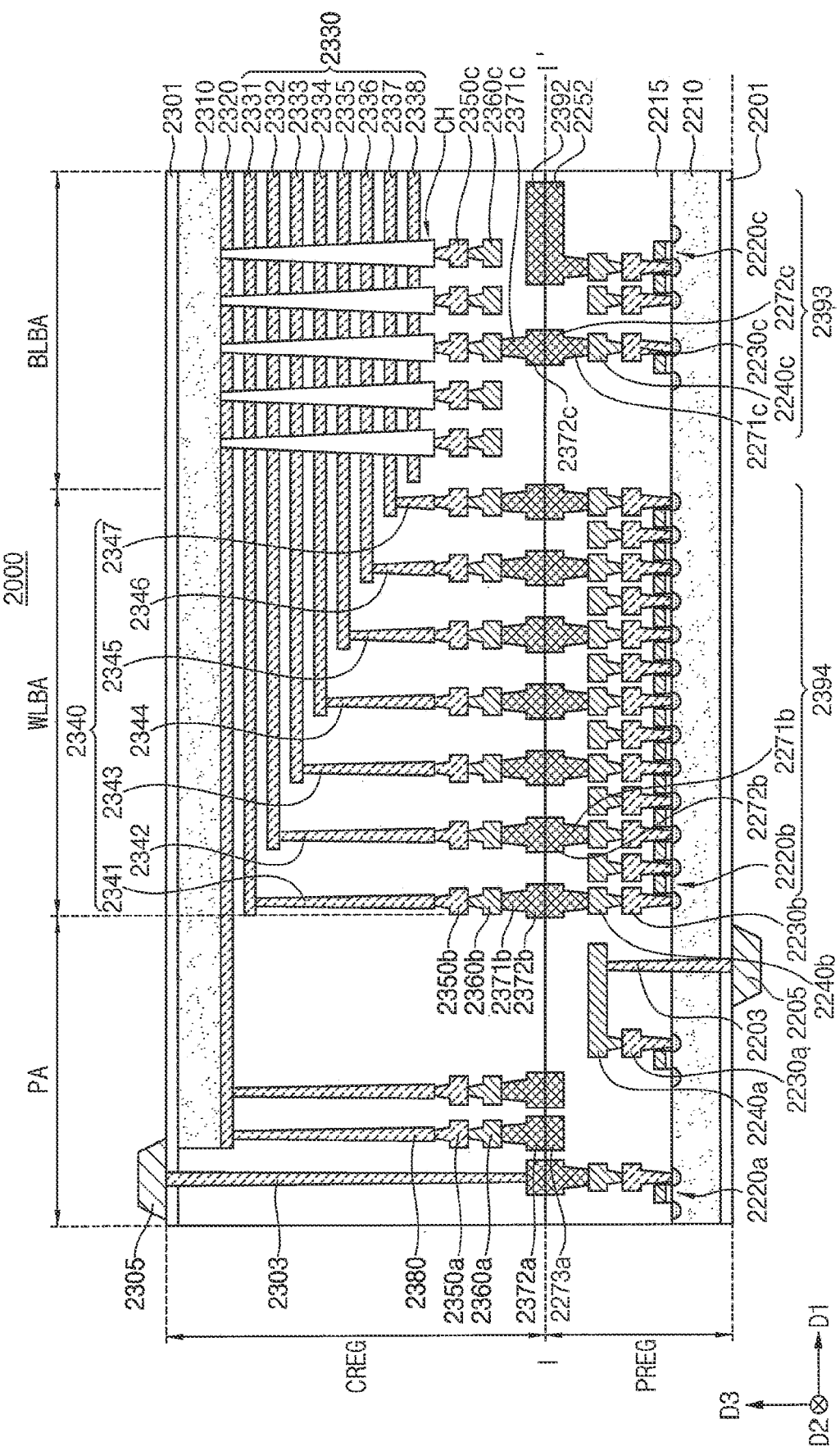
FIG. 22 is a cross-sectional diagram illustrating a nonvolatile memory device according to example embodiments.

FIG. 22 is a cross-sectional diagram illustrating a nonvolatile memory device according to example embodiments.

Referring to FIG. 22, a nonvolatile memory device 2000 may have a chip-to-chip (C2C) structure. Here, the term "C2C structure" denotes a structure in which an upper chip includes a memory cell region (e.g., the cell region CREG) on a first wafer, and a lower chip includes a peripheral circuit region (e.g., the peripheral region PREG) on a second wafer, in which the upper chip and the lower chip are bonded (or mounted) together at a bonding surface I-I'. In this regard, the bonding process may include a method of electrically connecting a bonding metal formed on an uppermost metal layer of the upper chip and a bonding metal formed on an uppermost metal layer of the lower chip. For example, when the bonding metals include copper (Cu), Cu-to-Cu bonding may be utilized. Example embodiments, however, are not limited thereto. For example, the bonding metals may also be formed of aluminum (Al) or tungsten (W).

Each of the peripheral region PREG and the cell region CREG of the nonvolatile memory device 2000 may include an external pad bonding area PA, a wordline bonding area WLBA, and a bitline bonding area BLBA.

The peripheral region PREG may include a first substrate 2210, an interlayer insulating layer 2215, circuit elements 2220a, 2220b, and 2220c formed on the first substrate 2210, first metal layers 2230a, 2230b, and 2230c respectively connected to the circuit elements 2220a, 2220b, and 2220c, and second metal layers 2240a, 2240b, and 2240c formed on the first metal layers 2230a, 2230b, and 2230c. In some embodiments, the first metal layers 2230a, 2230b, and 2230c may be formed of tungsten having relatively high electrical resistivity, and the second metal layers 2240a, 2240b, and 2240c may be formed of copper having relatively low electrical resistivity.

In some embodiments, such as the embodiment of FIG. 22, although only the first metal layers 2230a, 2230b, and 2230c and the second metal layers 2240a, 2240b, and 2240c are shown and described, example embodiments are not limited thereto. For example, in some embodiments, one or more additional metal layers may be further formed on the second metal layers 2240a, 2240b, and 2240c. At least a portion of the one or more additional metal layers formed on the second metal layers 2240a, 2240b, and 2240c may be formed of, for example, aluminum or the like having a lower electrical resistivity than those of copper forming the second metal layers 2240a, 2240b, and 2240c.

The interlayer insulating layer 2215 may be disposed on the first substrate 2210 and cover the circuit elements 2220a, 2220b, and 2220c, the first metal layers 2230a, 2230b, and 2230c, and the second metal layers 2240a, 2240b, and 2240c. The interlayer insulating layer 2215 may include an insulating material such as, for example, silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral region PREG may be electrically bonded to upper bonding metals 2371b and 2372b of the cell region CREG. The lower bonding metals 2271b and 2272b and the upper bonding metals 2371b and 2372b may be formed of, for example, aluminum, copper, tungsten, or the like. The upper bonding metals 2371b and 2372b in the cell region CREG may be referred as first metal pads, and the lower bonding metals 2271b and 2272b in the peripheral region PREG may be referred as second metal pads.

The cell region CREG may include at least one memory block. The cell region CREG may include a second substrate 2310 and a common source line 2320. On the second substrate 2310, wordlines 2331, 2332, 2333, 2334, 2335, 2336, 2337, and 2338 (collectively, 2330) may be vertically stacked (in the direction D3 or a Z-axis) perpendicular to an upper surface of the second substrate 2310. At least one string selection line and at least one ground selection line may be arranged on and below the wordlines 2330, respectively, and the wordlines 2330 may be disposed between the at least one string selection line and the at least one ground selection line.

In the bitline bonding area BLBA, a channel structure CH may vertically extend perpendicular to the upper surface of the second substrate 2310, and pass through the wordlines 2330, the at least one string selection line, and the at least one ground selection line. The channel structure CH may include, for example, a data storage layer, a channel layer, a buried insulating layer, and the like. The channel layer may be electrically connected to a first metal layer 2350c and a second metal layer 2360c. For example, the first metal layer 2350c may be a bitline contact, and the second metal layer 2360c may be a bitline. In an example embodiment, the bitline (the second metal layer 2360c) may extend in a second horizontal direction D2 (e.g., a Y-axis direction) parallel to the upper surface of the second substrate 2310.

In the illustrated example of FIG. 22, an area in which the channel structure CH, the bitline (the second metal layer 2360c), and the like are disposed may be defined as the bitline bonding area BLBA. In the bitline bonding area BLBA, the bitline (the second metal layer 2360c) may be electrically connected to the circuit elements 2220c providing a page buffer 2393 in the peripheral region PREG. The bitline (the second metal layer 2360c) may be connected to upper bonding metals 2371c and 2372c in the cell region CREG, and the upper bonding metals 2371c and 2372c may be connected to lower bonding metals 2271c and 2272c connected to the circuit elements 2220c of the page buffer 2393.

In the wordline bonding area WLBA, the wordlines 2330 may extend in a first horizontal direction D1 (e.g., an X-axis direction) parallel to the upper surface of the second substrate 2310 and perpendicular to the second horizontal direction D2, and may be connected to cell contact plugs 2341, 2342, 2343, 2344, 2345, 2346, and 2347 (collectively, 2340). The wordlines 2330 and the cell contact plugs 2340 may be connected to each other in pads provided by at least a portion of the wordlines 2330 extending in different lengths in the first horizontal direction D1. A first metal layer 2350b and a second metal layer 2360b may be connected to an upper portion of the cell contact plugs 2340 connected to the wordlines 2330, sequentially. The cell contact plugs 2340 may be connected to the peripheral region PREG by the upper bonding metals 2371b and 2372b of the cell region CREG and the lower bonding metals 2271b and 2272b of the peripheral region PREG in the wordline bonding area WLBA.

The cell contact plugs 2340 may be electrically connected to the circuit elements 2220b forming a row decoder 2394 in the peripheral region PREG. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as, for example, a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

I/O pads 2205 and 2305 may be disposed in the external pad bonding area PA. A lower insulating film 2201 covering a lower surface of the first substrate 2210 may be formed below the first substrate 2210, and a first I/O pad 2205 may be formed on the lower insulating film 2201. The first I/O pad 2205 may be connected to at least one of the circuit elements 2220a, 2220b, and 2220c disposed in the peripheral region PREG through a first I/O contact plug 2203, and may be separated from the first substrate 2210 by the lower insulating film 2201. In addition, a side insulating film may be disposed between the first I/O contact plug 2203 and the first substrate 2210 to electrically separate the first I/O contact plug 2203 and the first substrate 2210.

An upper insulating film 2301 covering the upper surface of the second substrate 2310 may be formed on the second substrate 2310, and a second I/O pad 2305 may be disposed on the upper insulating film 2301. The second I/O pad 2305 may be connected to at least one of the circuit elements 2220a, 2220b, and 2220c disposed in the peripheral region PREG through a second I/O contact plug 2303. In some embodiments, the second I/O pad 2305 is electrically connected to a circuit element 2220a.

In some embodiments, the second substrate 2310 and the common source line 2320 are not disposed in an area in which the second I/O contact plug 2303 is disposed. Also, in some embodiments, the second I/O pad 2305 does not overlap the wordlines 2330 in the vertical direction D3 (e.g., the Z-axis direction). The second I/O contact plug 2303 may be separated from the second substrate 2310 in the direction parallel to the upper surface of the second substrate 310, and may pass through the interlayer insulating layer 2315 of the cell region CREG to be connected to the second I/O pad 2305.

According to embodiments, the first I/O pad 2205 and the second I/O pad 2305 may be selectively formed. For example, in some embodiments, the nonvolatile memory device 2000 may include only the first I/O pad 2205 disposed on the first substrate 2210 or the second I/O pad 2305 disposed on the second substrate 2310. Alternatively, in some embodiments, the memory device 200 may include both the first I/O pad 2205 and the second I/O pad 2305.

A metal pattern provided on an uppermost metal layer may be provided as a dummy pattern or the uppermost metal layer may be absent, in each of the external pad bonding area PA and the bitline bonding area BLBA, respectively included in the cell region CREG and the peripheral region PREG.

In the external pad bonding area PA, the nonvolatile memory device 2000 may include a lower metal pattern 2273a, corresponding to an upper metal pattern 2372a formed in an uppermost metal layer of the cell region CREG, and having the same cross-sectional shape as the upper metal pattern 2372a of the cell region CREG so as to be connected to each other, in an uppermost metal layer of the peripheral region PREG. In some embodiments, in the peripheral region PREG, the lower metal pattern 2273a formed in the uppermost metal layer of the peripheral region PREG is not connected to a contact. In similar manner, in the external pad bonding area PA, an upper metal pattern 2372a, corresponding to the lower metal pattern 2273a formed in an uppermost metal layer of the peripheral region PREG, and having the same shape as a lower metal pattern 2273a of the peripheral region PREG, may be formed in an uppermost metal layer of the cell region CREG.

The lower bonding metals 2271b and 2272b may be formed on the second metal layer 2240b in the wordline bonding area WLBA. In the wordline bonding area WLBA, the lower bonding metals 2271b and 2272b of the peripheral region PREG may be electrically connected to the upper bonding metals 2371b and 2372b of the cell region CREG by, for example, Cu-to-Cu bonding.

Further, in the bitline bonding area BLBA, an upper metal pattern 2392, corresponding to a lower metal pattern 2252 formed in the uppermost metal layer of the peripheral region PREG, and having the same cross-sectional shape as the lower metal pattern 2252 of the peripheral region PREG, may be formed in an uppermost metal layer of the cell region CREG. In some embodiments, a contact is not formed on the upper metal pattern 2392 formed in the uppermost metal layer of the cell region CREG FIG. 23 is a conceptual diagram illustrating manufacture of a stacked semiconductor device according to example embodiments.

Figure 23:
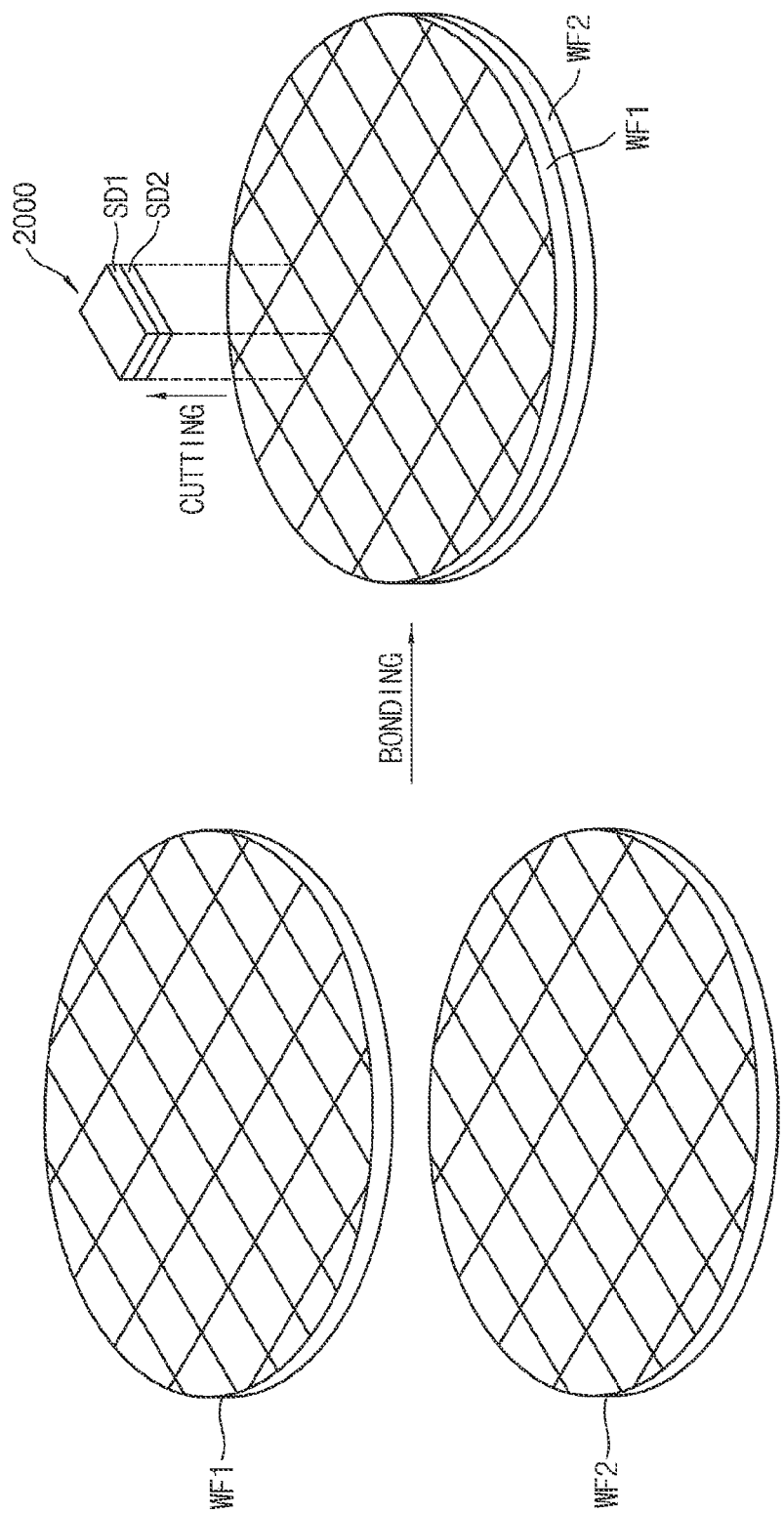
FIG. 23 is a conceptual diagram illustrating manufacture of a stacked semiconductor device according to example embodiments.

Referring to FIG. 23, respective integrated circuits may be formed on a first wafer WF1 and a second wafer WF2. The memory cell array may be formed in the first wafer WF1 and the peripheral circuits may be formed in the second wafer WF2.

After the various integrated circuits have been respectively formed on the first and second wafers WF1 and WF2, the first wafer WF1 and the second wafer WF2 may be bonded together. The bonded wafers WF1 and WF2 may then be cut (or divided) into separate chips, in which each chip corresponds to a semiconductor device such as, for example, the nonvolatile memory device 2000, including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to the second semiconductor die SD2.

Figure 24:
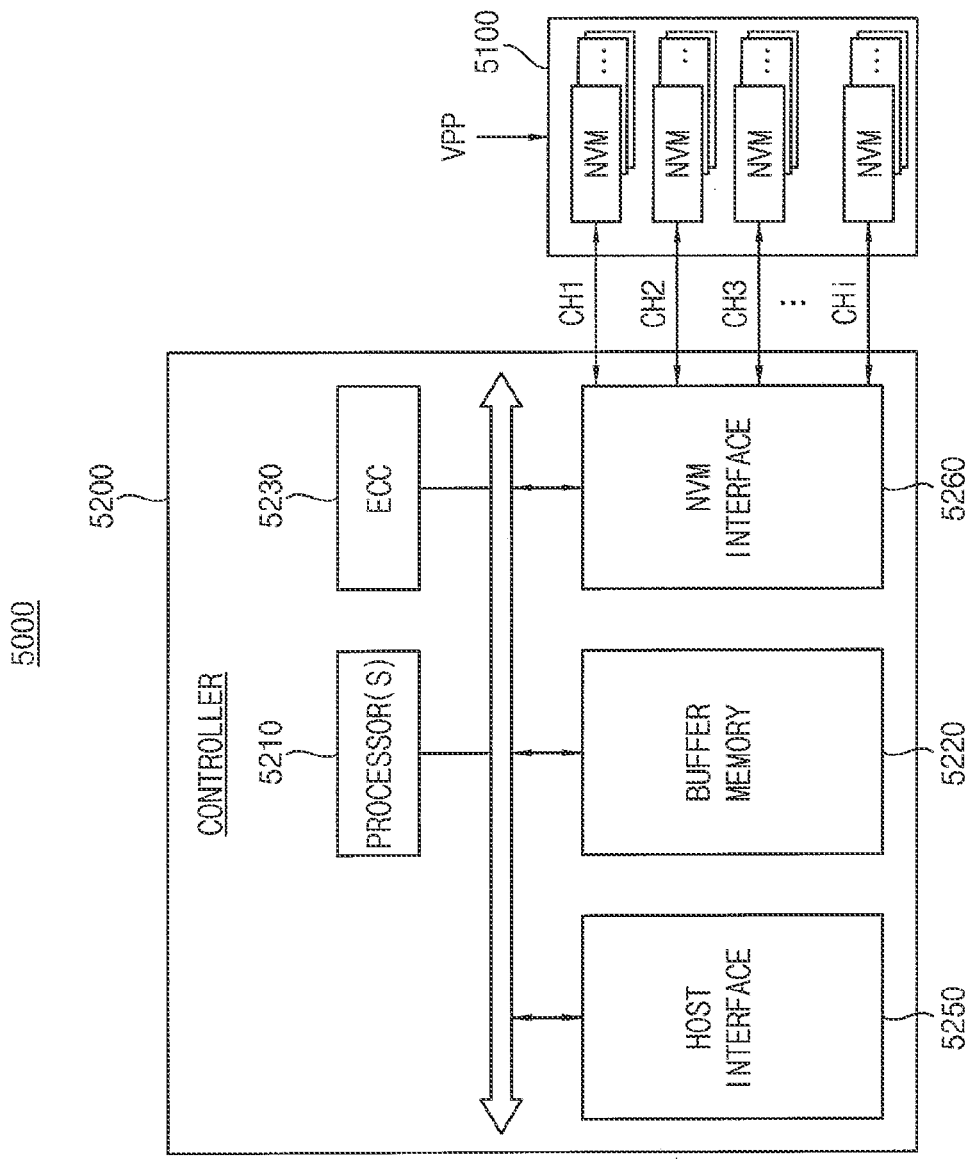
FIG. 24 is a block diagram illustrating a solid state or solid state drive (SSD) according to example embodiments.

FIG. 24 is a block diagram illustrating a solid state or solid state drive (SSD) according to example embodiments.

Referring to FIG. 24, an SSD 5000 may generally include nonvolatile memory devices 5100 and an SSD controller 5200.

The nonvolatile memory devices 5100 may (optionally) be configured to receive a high voltage VPP. One or more of the nonvolatile memory devices 5100 may be provided as memory device(s) according to embodiments of the inventive concept described above. Accordingly, the nonvolatile memory devices 5100 may reduce or prevent soft erase of the unselected memory block by preventing the precharge of the unselected memory block BLK while the channels of the selected memory block are precharged.

The SSD controller 5200 is connected to the nonvolatile memory devices 5100 via multiple channels CH1, CH2, CHI3, . . . Chi, in which i is a natural number. The SSD controller 1200 includes one or more processors 5210, a buffer memory 5220, an error correction code (ECC) circuit 5230, a host interface 5250, and a nonvolatile memory interface 5260. The buffer memory 5220 stores data used to drive the SSD controller 5200. The buffer memory 5220 includes multiple memory lines, each storing data or a command. The ECC circuit 5230 calculates error correction code values of data to be programmed at a writing operation, and corrects an error of read data using an error correction code value at a read operation. In a data recovery operation, The ECC circuit 5230 corrects an error of data recovered from the nonvolatile memory devices 5100.

As described above, the nonvolatile memory device and the method of programming in the nonvolatile memory device according to example embodiments may reduce or prevent soft erase of the unselected memory block by preventing the precharge of the unselected memory block while precharging the channels of the selected memory block. In addition, the nonvolatile memory device and the method of programming in the nonvolatile memory device according to example embodiments may reduce program voltage disturbance and pass voltage disturbance by precharging the channels of the selected memory block.

In an example embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an example embodiment of the present inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Embodiments of the inventive concept may be applied to any electronic devices and systems including a nonvolatile memory device. For example, embodiments of the inventive concept may be applied to systems such as a memory card, a solid state drive (SSD), an embedded multimedia card (eMMC), a universal flash storage (UFS), a mobile phone, a smartphone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an Internet of Things (IoT) device, an Internet of Everything (IoE) device, an e-book, a virtual reality (VR) device, an augmented reality (AR) device, etc.

While the present inventive concept has been particularly shown and described with reference to the example embodiments thereof, it will be understood by those of ordinary skill in the art that various changes in form and detail may be made therein without departing from the spirit and scope of the present inventive concept as defined by the following claims.

What is claimed is:

1. A method of programming in a nonvolatile memory device including a plurality of cell strings commonly connected between a plurality of bitlines and a source line, the plurality of cell strings being grouped into a plurality of memory blocks, the method comprising:
   during a precharge period, precharging channels of the cell strings of a selected memory block among the plurality of memory blocks by applying a gate induced drain leakage (GIDL) on voltage to gates of GIDL transistors included in the cell strings of the selected memory block, the GIDL on voltage having a voltage level that induces GIDL;
   during the precharge period, preventing a precharge of channels of the cell strings of an unselected memory block among the plurality of memory blocks by controlling a gate voltage of GIDL transistors included in the cell strings of the unselected memory block such that the GIDL is prevented; and
   during a program execution period after the precharge period, programming memory cells of the selected memory block connected to a selected wordline by applying a program voltage to the selected wordline.

2. The method of claim 1, wherein preventing the precharge of the channels of the cell strings of the unselected memory block comprises:
   during the precharge period, applying a GIDL off voltage to gates of the GIDL transistors included in the cell strings of the unselected memory block, the GIDL off voltage having a voltage level that prevents the GIDL.

3. The method of claim 2, wherein the GIDL off voltage has a positive voltage level higher than the GIDL on voltage.

4. The method of claim 1, wherein preventing the precharge of the channels of cell strings of the unselected memory block comprises:
   during the precharge period, floating gates of the GIDL transistors included in the cell strings of the unselected memory block.

5. The method of claim 4, wherein, during the precharge period, the gate voltage of the GIDL transistors included in the cell strings of the unselected memory block is boosted to a GIDL off voltage such that the GIDL is prevented.

6. The method of claim 1, wherein the GIDL on voltage has a negative voltage level.

7. The method of claim 1, wherein the GIDL transistors included in the cell strings of the selected memory block and in the cell strings of the unselected memory block include GIDL string selection transistors that are connected to the plurality of bitlines.

8. The method of claim 7, further comprising:
   during the precharge period, applying a GIDL drain voltage to the plurality of bitlines such that the GIDL drain voltage has a voltage level higher than a voltage difference between a GIDL threshold voltage and the GIDL on voltage.

9. The method of claim 8, further comprising:
   during a bitline setup period between the precharge period and the program execution period, applying a program inhibition voltage to the bitlines corresponding to a program bit of a first value; and during the bitline setup period, applying a program permission voltage to the bitlines corresponding to a program bit of a second value.

10. The method of claim 7, further comprising:
during the precharge period, applying a GIDL drain voltage to the bitlines corresponding to a program bit of a first value such that the GIDL drain voltage has a voltage level higher than a voltage difference between a GIDL threshold voltage and the GIDL on voltage;
during a bitline setup period between the precharge period and the program execution period, applying a program inhibition voltage to the bitlines corresponding to the program bit of the first value; and
during the bitline setup period, applying a program permission voltage to the bitlines corresponding to a program bit of a second value.

11. The method of claim 1, wherein the GIDL transistors included in the cell strings of the selected memory block and in the cell strings of the unselected memory block include GIDL ground selection transistors that are connected to the source line.

12. The method of claim 11, further comprising:
during the precharge period, applying a GIDL drain voltage to the source line such that the GIDL drain voltage has a voltage level higher than a voltage difference between a GIDL threshold voltage and the GIDL on voltage.

13. The method of claim 12, further comprising:
during the precharge period, applying a program inhibition voltage to the plurality of bitlines;
during a bitline setup period between the precharge period and the program execution period, applying the program inhibition voltage to the bitlines corresponding to a program bit of a first value; and
during the bitline setup period, applying a program permission voltage to the bitlines corresponding to a program bit of a second value.

14. The method of claim 12, further comprising:
during a bitline setup period between the precharge period and the program execution period, applying a program inhibition voltage to the bitlines corresponding to a program bit of a first value; and
during the bitline setup period, applying a program permission voltage to the bitlines corresponding to a program bit of a second value.

15. The method of claim 1, wherein the GIDL transistors included in the cell strings of the selected memory block and in the cell strings of the unselected memory block include GIDL string selection transistors that are connected to the plurality of bitlines and GIDL ground selection transistors that are connected to the source line.

16. The method of claim 15, further comprising:
during the precharge period, applying a GIDL drain voltage to the plurality of bitlines such that the GIDL drain voltage has a voltage level higher than a voltage difference between a GIDL threshold voltage and the GIDL on voltage; and
during the precharge period, applying the GIDL drain voltage to the source line.

17. The method of claim 16, further comprising:
during a bitline setup period between the precharge period and the program execution period, applying a program inhibition voltage to the bitlines corresponding to a program bit of a first value; and
during the bitline setup period, applying a program permission voltage to the bitlines corresponding to a program bit of a second value.

18. The method of claim 15, further comprising:
during the precharge period, applying a GIDL drain voltage to the bitlines corresponding to a program bit of a first value such that the GIDL drain voltage has a voltage level higher than a voltage difference between a GIDL threshold voltage and the GIDL on voltage;
during the precharge period, applying the GIDL drain voltage to the source line;
during a bitline setup period between the precharge period and the program execution period, applying a program inhibition voltage to the bitlines corresponding to the program bit of the first value; and
during the bitline setup period, applying a program permission voltage to the bitlines corresponding to a program bit of a second value.

19. A nonvolatile memory device, comprising:
a memory cell array including a plurality of cell strings commonly connected between a plurality of bitlines and a source line, the plurality of cell strings being grouped into a plurality of memory blocks; and
a control circuit configured to:
during a precharge period, precharge channels of the cell strings of a selected memory block among the plurality of memory blocks by applying a gate induced drain leakage (GIDL) on voltage to gates of GIDL transistors included in the cell strings of the selected memory block, the GIDL on voltage having a voltage level that induces GIDL;
during the precharge period, prevent a precharge of channels of the cell strings of an unselected memory block among the plurality of memory blocks by controlling a gate voltage of GIDL transistors included in the cell strings of the unselected memory block such that the GIDL is prevented; and
during a program execution period after the precharge period, program memory cells of the selected memory block connected to a selected wordline by applying a program voltage to the selected wordline.

20. A nonvolatile memory device, comprising:
a plurality of first metal pads disposed in a cell region;
a plurality of second metal pads disposed in a peripheral region disposed under the cell region, wherein the peripheral region is vertically connected to the cell region by the first metal pads and the second metal pads;
a plurality of bitlines disposed at a first end portion of the cell region, arranged in a first horizontal direction, and extending in a second horizontal direction;
a source line disposed at a second end portion of the cell region and extending in the second horizontal direction;
a plurality of cell channel structures disposed in a cell string area of the cell region and commonly connected between the plurality of bitlines and the source line, wherein the plurality of cell channel structures is grouped into a plurality of memory blocks, and each one of the cell channel structures includes a string selection transistor, a ground selection transistor, and a plurality of memory cells;
a gate electrode structure vertically stacked in the cell string area, wherein the gate electrode structure includes a plurality of string selection lines, a plurality of ground selection lines, and a plurality of wordlines; and
a control circuit disposed in the peripheral region and configured to:
during a precharge period, precharge channels of the cell channel structures of a selected memory block among the plurality of memory blocks by applying a gate induced drain leakage (GIDL) on voltage to the string selection line or the ground selection line of the selected memory block, the GIDL on voltage having a voltage level that induces GIDL;

during the precharge period, prevent a precharge of channels of the cell channel structures of an unselected memory block among the plurality of memory blocks by controlling a voltage of the string selection line or the ground selection line of the unselected memory block such that the GIDL is prevented; and during a program execution period after the precharge period, program memory cells of the selected memory block connected to a selected wordline by applying a program voltage to the selected wordline.

* * * * *